US010522692B2

(12) United States Patent
Yamazaki

(10) Patent No.: US 10,522,692 B2
(45) Date of Patent: Dec. 31, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/147,069

(22) Filed: May 5, 2016

(65) Prior Publication Data

US 2016/0247939 A1 Aug. 25, 2016

Related U.S. Application Data

(60) Continuation of application No. 14/597,546, filed on Jan. 15, 2015, now Pat. No. 9,337,321, which is a
(Continued)

(30) Foreign Application Priority Data

Dec. 28, 2010 (JP) .................................. 2010-292895

(51) Int. Cl.
*H01L 29/12* (2006.01)
*H01L 29/786* (2006.01)
(Continued)

(52) U.S. Cl.
CPC .. *H01L 29/78693* (2013.01); *H01L 21/02565* (2013.01); *H01L 21/477* (2013.01);
(Continued)

(58) Field of Classification Search
CPC ............ H01L 29/7869; H01L 27/1225; H01L 29/78696; H01L 29/66969;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 101356652 A 1/2009
CN 101401213 A 4/2009
(Continued)

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
(Continued)

*Primary Examiner* — Thien F Tran
(74) *Attorney, Agent, or Firm* — Robinson Intellectual Property Law Office; Eric J. Robinson

(57) ABSTRACT

A semiconductor device in which fluctuation in electric characteristics due to miniaturization is less likely to be caused is provided. The semiconductor device includes an oxide semiconductor film including a first region, a pair of second regions in contact with side surfaces of the first region, and a pair of third regions in contact with side surfaces of the pair of second regions; a gate insulating film provided over the oxide semiconductor film; and a first electrode that is over the gate insulating film and overlaps with the first region. The first region is a CAAC oxide semiconductor region. The pair of second regions and the pair of third regions are each an amorphous oxide semiconductor region containing a dopant. The dopant concentration of the pair of third regions is higher than the dopant concentration of the pair of second regions.

8 Claims, 15 Drawing Sheets

Related U.S. Application Data division of application No. 13/330,749, filed on Dec. 20, 2011, now Pat. No. 8,941,112.

(51) Int. Cl.

| | |
|---|---|
| *H01L 29/66* | (2006.01) |
| *H01L 21/02* | (2006.01) |
| *H01L 21/477* | (2006.01) |
| *H01L 29/04* | (2006.01) |
| *H01L 29/08* | (2006.01) |
| *H01L 29/24* | (2006.01) |
| *H01L 29/49* | (2006.01) |
| *H01L 29/51* | (2006.01) |
| *H01L 27/12* | (2006.01) |

(52) U.S. Cl.
CPC ........ *H01L 27/1225* (2013.01); *H01L 29/045* (2013.01); *H01L 29/0847* (2013.01); *H01L 29/24* (2013.01); *H01L 29/4908* (2013.01); *H01L 29/517* (2013.01); *H01L 29/66742* (2013.01); *H01L 29/66969* (2013.01); *H01L 29/7869* (2013.01); *H01L 29/78621* (2013.01); *H01L 29/78696* (2013.01)

(58) Field of Classification Search
CPC ............... H01L 29/78693; H01L 29/24; H01L 21/02565; H01L 29/4908; H01L 29/045; H01L 29/66742; H01L 29/247; H01L 21/477; H01L 29/78621; H01L 29/0847; H01L 29/517
USPC ...... 257/43, 52, E29.095, E33.004, E29.101, 257/E29.08, E29.083, E31.047
See application file for complete search history.

(56) References Cited

U.S. PATENT DOCUMENTS

| | | |
|---|---|---|
| 5,744,864 A | 4/1998 | Cillessen et al. |
| 5,817,548 A | 10/1998 | Noguchi et al. |
| 5,943,593 A | 8/1999 | Noguchi et al. |
| 6,087,679 A | 7/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,057,237 B2 | 6/2006 | Wang et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,640 B2 | 4/2007 | Yoshioka et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,655,994 B2 | 2/2010 | Cartier et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 7,804,091 B2 | 9/2010 | Takechi et al. |
| 7,858,500 B2 | 12/2010 | Cartier et al. |
| 7,884,360 B2 | 2/2011 | Takechi et al. |
| 7,993,964 B2 | 8/2011 | Hirao et al. |
| 8,003,981 B2 | 8/2011 | Iwasaki et al. |
| 8,030,643 B2 | 10/2011 | Asami et al. |
| 8,035,102 B2 | 10/2011 | Lee et al. |
| 8,093,589 B2 | 1/2012 | Sugihara et al. |
| 8,095,104 B2 | 1/2012 | Kawae et al. |
| 8,164,090 B2 | 4/2012 | Iwasaki et al. |
| 8,202,365 B2 | 6/2012 | Umeda et al. |
| 8,232,124 B2 | 7/2012 | Takechi et al. |
| 8,238,152 B2 | 8/2012 | Asami et al. |
| 8,241,936 B2 | 8/2012 | Lee et al. |
| 8,368,067 B2 | 2/2013 | Uchiyama et al. |
| 8,378,341 B2 | 2/2013 | Hayashi et al. |
| 8,384,076 B2 | 2/2013 | Park et al. |
| 8,420,442 B2 | 4/2013 | Takechi et al. |
| 8,526,216 B2 | 9/2013 | Asami et al. |
| 8,804,404 B2 | 8/2014 | Asami et al. |
| 8,889,480 B2 | 11/2014 | Takechi et al. |
| 9,129,866 B2 | 9/2015 | Asami et al. |
| 9,129,937 B2 | 9/2015 | Hayashi et al. |
| 9,312,394 B2 | 4/2016 | Hayashi et al. |
| 9,786,669 B2 | 10/2017 | Asami et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0020520 A1 | 1/2003 | Miyake et al. |
| 2003/0189401 A1 | 10/2003 | Kido et al. |
| 2003/0209737 A1 | 11/2003 | Mitani et al. |
| 2003/0218222 A1 | 11/2003 | Wager, III et al. |
| 2004/0031983 A1* | 2/2004 | Huang ............. H01L 27/10885 257/310 |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0173734 A1 | 8/2005 | Yoshioka et al. |
| 2005/0199959 A1 | 9/2005 | Chiang et al. |
| 2005/0258491 A1 | 11/2005 | Bojarczuk, Jr. et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |

(56) References Cited

U.S. PATENT DOCUMENTS

| | | |
|---|---|---|
| 2008/0116500 A1 | 5/2008 | Tokunaga |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277656 A1 | 11/2008 | Park et al. |
| 2008/0296568 A1 | 12/2008 | Ryu et al. |
| 2009/0008645 A1 | 1/2009 | Yamazaki et al. |
| 2009/0065771 A1 | 3/2009 | Iwasaki et al. |
| 2009/0068773 A1 | 3/2009 | Lai et al. |
| 2009/0072321 A1 | 3/2009 | Arao et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0007829 A1* | 1/2010 | Oikawa ............ G02F 1/133305 349/122 |
| 2010/0007942 A1* | 1/2010 | Oikawa ............ G02F 1/167 359/296 |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0109002 A1 | 5/2010 | Itagaki et al. |
| 2010/0123127 A1* | 5/2010 | Inoue ............ C09K 11/06 257/40 |
| 2010/1011707 | 5/2010 | Yamazaki et al. |
| 2010/0155721 A1 | 6/2010 | Lee et al. |
| 2010/0224871 A1 | 9/2010 | Yamaguchi et al. |
| 2011/0042670 A1* | 2/2011 | Sato ............ H01L 29/78621 257/43 |
| 2011/0147738 A1 | 6/2011 | Yamazaki et al. |
| 2011/0175090 A1 | 7/2011 | Sugihara et al. |
| 2011/0256684 A1 | 10/2011 | Iwasaki et al. |
| 2012/0081186 A1 | 4/2012 | Kawae et al. |
| 2012/0161121 A1 | 6/2012 | Yamazaki |
| 2012/0161122 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2016/0211173 A1 | 7/2016 | Hayashi et al. |

FOREIGN PATENT DOCUMENTS

| | | |
|---|---|---|
| CN | 101582453 A | 11/2009 |
| EP | 1209748 | 5/2002 |
| EP | 1443130 A | 8/2004 |
| EP | 1737044 A | 12/2006 |
| EP | 2120267 A | 11/2009 |
| EP | 2175493 A | 4/2010 |
| EP | 2226847 A | 9/2010 |
| EP | 2408011 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 05-251705 A | 9/1993 |
| JP | 06-275697 A | 9/1994 |
| JP | 08-264794 A | 10/1996 |
| JP | 09-036364 A | 2/1997 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-328059 A | 11/2005 |
| JP | 2006-310799 A | 11/2006 |
| JP | 2007-096055 A | 4/2007 |
| JP | 2007-123861 A | 5/2007 |
| JP | 2007-184610 A | 7/2007 |
| JP | 2007-220816 A | 8/2007 |
| JP | 2007-250983 A | 9/2007 |
| JP | 2008-035498 A | 2/2008 |
| JP | 2008-040343 A | 2/2008 |
| JP | 2008-042088 A | 2/2008 |
| JP | 2008-112909 A | 5/2008 |
| JP | 2008-277665 A | 11/2008 |
| JP | 2009-514218 | 4/2009 |
| JP | 2009-167087 A | 7/2009 |
| JP | 2009-528670 | 8/2009 |
| JP | 2009-535819 | 10/2009 |
| JP | 2009-278115 A | 11/2009 |
| JP | 2010-093070 A | 4/2010 |
| JP | 2010-135774 A | 6/2010 |
| JP | 2010-140919 A | 6/2010 |
| JP | 2010-141230 A | 6/2010 |
| TW | 200428570 | 12/2004 |
| WO | WO-2004/114391 | 12/2004 |
| WO | WO-2007/050312 | 5/2007 |
| WO | WO-2007/119386 | 10/2007 |
| WO | WO-2007/142167 | 12/2007 |
| WO | WO-2008/027392 | 3/2008 |
| WO | WO-2011/074407 | 6/2011 |

OTHER PUBLICATIONS

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 347-376.

Du Ahn.B et al., "Comparison of the effects of Ar and H2 plasmas on the performance of homojunctioned amorphous indium gallium zinc oxide thin film transistors", Appl. Phys. Lett. (Applied Physics Letters) , 2008, vol. 93, No. 20, pp. 203506-1-203506-3.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2659.

Kimizuka.N et al., "SPINEL, YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m =3, 4, and 5), InGaO3(ZnO)3,

(56) References Cited

OTHER PUBLICATIONS and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophqsphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of The Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID Interntional Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of The 16th International Display Workshops, 2009, pp. 659-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193
Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 86, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristailographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in The Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review, B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GiZo (Ga2O3-In2O3-ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of The 6th Internatioanl Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.
Ueno,K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Chinese Office Action (Application No. 201110462045.7) dated Jul. 23, 2015.
Taiwanese Office Action (Application No. 100148627) dated Aug. 12, 2015.
Chinese Office Action (Application No. 201110462045.7) dated Dec. 24, 2015.

\* cited by examiner

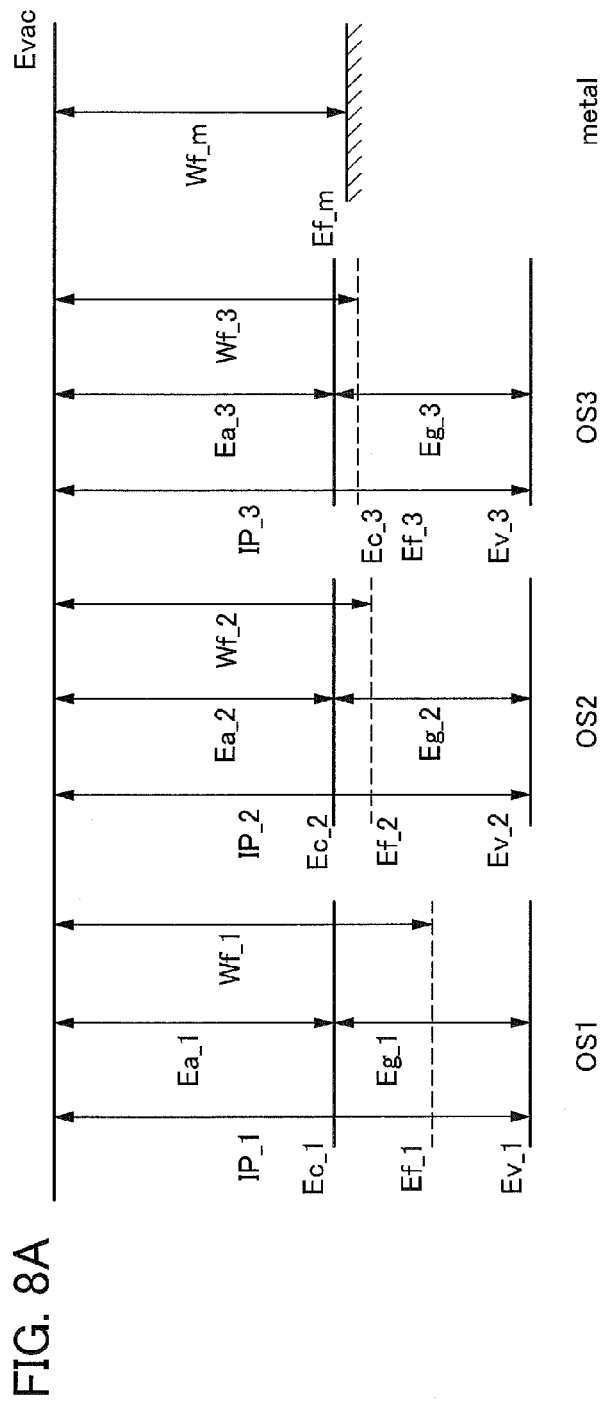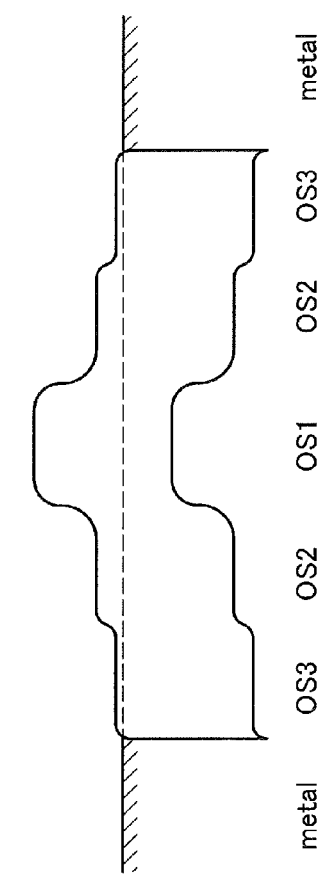
FIG. 8A
FIG. 8B

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a method for manufacturing the semiconductor device.

In this specification, the semiconductor device refers to all devices that can function by utilizing semiconductor characteristics. A transistor in this specification is a semiconductor device, and an electrooptic device, a semiconductor circuit, and an electronic device including the transistor are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

Attention has been directed to a technique in which, instead of the above silicon semiconductors, metal oxides exhibiting semiconductor characteristics are used for transistors. Note that in this specification, a metal oxide exhibiting semiconductor characteristics is referred to as an oxide semiconductor.

For example, a technique is disclosed in which a transistor is manufactured using zinc oxide or an In—Ga—Zn—O-based oxide as an oxide semiconductor and the transistor is used as a switching element or the like of a pixel of a display device (see Patent Documents 1 and 2).

Further, a technique is disclosed in which in a transistor including an oxide semiconductor, a highly conductive oxide semiconductor containing nitrogen is provided as buffer layers between a source region and a source electrode and between a drain region and a drain electrode, and thereby the contact resistance between the oxide semiconductor and the source electrode and between the oxide semiconductor and the drain electrode is reduced (see Patent Document 3).

Further, as a method for forming a source region and a drain region of a transistor including an oxide semiconductor in a self-aligned manner, a method is disclosed in which a surface of the oxide semiconductor is exposed and argon plasma treatment is performed, and thereby the resistivity of the exposed portion of the oxide semiconductor is reduced (see Non-Patent Document 1).

In this method, however, since the surface of the oxide semiconductor is exposed and argon plasma treatment is performed, portions of the oxide semiconductor to be the source region and the drain region are also etched, leading to decrease in the thicknesses of the source region and the drain region (see FIG. 8 in Non-Patent Document 1). As a result, the resistance of the source region and the drain region is increased, and in addition, defective products are produced with higher probability owing to overetching due to the decrease in thickness.

This phenomenon is remarkable in the case where the atomic radius of an ion species used for the plasma treatment on the oxide semiconductor is large.

Such a problem does not arise if an oxide semiconductor layer has a sufficient thickness. However, when the channel length is less than or equal to 200 nm, it is necessary that the thickness of a portion of the oxide semiconductor layer which serves as a channel be less than or equal to 20 nm, preferably less than or equal to 10 nm, for prevention of a short-channel effect. The above plasma treatment is not suitable in the case where such a thin oxide semiconductor layer is used.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-135774

Non-Patent Document

[Non-Patent Document 1] S. Jeon et al., "180 nm Gate Length Amorphous InGaZnO Thin Film Transistor for High Density Image Sensor Application", IEDM Tech. Dig., p. 504, 2010.

SUMMARY OF THE INVENTION

In an integrated circuit including a transistor, the transistor needs to be miniaturized to achieve higher integration.

A transistor whose channel length is extremely shortened for miniaturization may have fluctuation in electric characteristics, such as decrease in the threshold voltage. This phenomenon is called a short-channel effect, and suppression of the short-channel effect is a challenge for miniaturization of a transistor.

It is known that a transistor including an oxide semiconductor particularly has small off-state current at room temperature, as compared with a transistor including silicon. It is considered that this is because the number of carriers generated by thermal excitation is small, that is, the carrier density is low.

An object of one embodiment of the present invention is to provide a semiconductor device in which fluctuation in electric characteristics due to miniaturization is less likely to be caused.

As a means for achieving the above object, in a transistor including an oxide semiconductor, a region containing a dopant is provided in an oxide semiconductor film including a channel formation region. Specifically, two pairs of amorphous regions each containing a dopant are provided in the oxide semiconductor film including the channel formation region, and the dopant concentration is varied between the pairs of regions. In this manner, an electric field generated in a drain region of the oxide semiconductor film can relieve an electric field applied to the channel formation region, and thus a short-channel effect can be suppressed. Note that in this specification, a dopant collectively refers to elements added to an oxide semiconductor film including a channel formation region.

In addition, the oxide semiconductor of the channel formation region is non-single-crystal; specifically, the channel formation region includes crystal portion in which atoms are arranged in a triangle, a hexagon, a regular triangle, or a regular hexagon when seen from the direction perpendicular to the a-b plane of the non-single-crystal and in which metal atoms or metal atoms and oxygen atoms are arranged in layers when seen from the direction perpendicular to the c-axis. Note that in this specification, such crystal portion is referred to as c-axis aligned crystal (CAAC) and such oxide semiconductor including the c-axis aligned crystal is referred to as CAAC oxide semiconductor (CAAC-OS: c-axis aligned crystalline oxide semiconductor). With the channel formation region is formed as a CAAC oxide semiconductor region, fluctuation in electric characteristics of the transistor due to irradiation with visible light or ultraviolet light can be suppressed and the reliability of the semiconductor device can be improved.

One embodiment of the present invention is a semiconductor device which includes an oxide semiconductor film including a first region, a pair of second regions in contact with side surfaces of the first region, and a pair of third regions in contact with side surfaces of the pair of second regions; a gate insulating film provided over the oxide semiconductor film; and a first electrode that is over the gate insulating film and overlaps with the first region. The first region is a CAAC oxide semiconductor region. The pair of second regions and the pair of third regions are each an amorphous oxide semiconductor region containing a dopant. The dopant concentration of the pair of third regions is higher than the dopant concentration of the pair of second regions.

The oxide semiconductor film preferably contains two or more elements selected from In, Ga, Sn, and Zn.

The above semiconductor device further includes a second electrode and a third electrode that are electrically connected to the pair of third regions.

The pair of second regions and the pair of third regions can be formed in a self-aligned manner by adding the dopant through the gate insulating film and a sidewall insulating film provided on side surfaces of the first electrode. In other words, with the sidewall insulating film, the pair of second regions can be regions to which a smaller amount of dopant is added (referred to as low-concentration regions in this specification). The pair of third regions can be regions to which a larger amount of dopant is added (referred to as high-concentration regions in this specification). Further, with the sidewall insulating film, the pair of second regions can be provided between the first region functioning as a channel formation region and the pair of third regions functioning as a source region and a drain region.

The dopant added to the pair of second regions and the pair of third regions is hydrogen or one or more elements selected from rare gas elements, and the concentration of the dopant contained in each of the pair of second regions and the pair of third regions is preferably higher than or equal to $1 \times 10^{19}$ atoms/cm$^3$ and lower than or equal to $1 \times 10^{22}$ atoms/cm$^3$. It is further preferable that the dopant concentration of the pair of second regions be higher than or equal to $5 \times 10^{18}$ atoms/cm$^3$ and lower than $5 \times 10^{19}$ atoms/cm$^3$ and that the dopant concentration of the pair of third regions be higher than or equal to $5 \times 10^{19}$ atoms/cm$^3$ and lower than or equal to $1 \times 10^{22}$ atoms/cm$^3$.

In the semiconductor device according to one embodiment of the present invention, the second electrode and the third electrode may be in contact with either top surfaces of the pair of third regions or bottom surfaces of the pair of third regions.

An area where the gate insulating film is formed depends on how to form the sidewall insulating film. Specifically, the gate insulating film can be formed over the first region, the second regions, and the third regions or only over the first region.

In the case where a nitride insulating film is used as the sidewall insulating film and an oxide insulating film is used as the gate insulating film, the gate insulating film functions as an etching stopper in formation of the sidewall insulating film owing to the etching selectivity between the nitride insulator and the oxide insulator, so that excessive etching of the oxide semiconductor film in contact with a bottom surface of the gate insulating film can be suppressed. As a result, in the semiconductor device having the structure, the gate insulating film is left over the first region, the pair of second regions, and the pair of third regions.

In the case where an oxide insulating film is used as each of the sidewall insulating film and the gate insulating film, the gate insulating film provided over the pair of second regions and the pair of third regions can be etched by utilizing the etching selectivity between the oxide insulating film and the first electrode. As a result, in the semiconductor device having the structure, the gate insulating film is left over the first region.

The addition of the dopant for forming the low-concentration regions and the high-concentration regions in the transistor which is one embodiment of the present invention can be performed by an ion doping method, an ion implantation method, or the like. Furthermore, instead of performing ion doping or ion implantation, the dopant can be added by generating plasma in an atmosphere of a gas containing the dopant added and performing plasma treatment on an object to which the dopant is added.

In addition, in the case where an element with a large atomic radius, such as a rare gas element, is added as the dopant, it is preferable that the above plasma treatment be performed with the oxide semiconductor film covered with the gate insulating film (with the gate insulating film provided over the first region, the pair of second regions, and the pair of third regions) for the following reason. In the manufacturing process of the transistor, if the above plasma treatment is performed with the oxide semiconductor film exposed, portions of the oxide semiconductor film to be the pair of third regions might be etched and decreased in thickness.

In this manner, the portions of the oxide semiconductor film to be the high-concentration regions can be prevented from being etched and decrease in the thicknesses of the high-concentration regions can be suppressed. In addition, cleanliness of the interface between the oxide semiconductor film and the gate insulating film can be maintained, and thus the electric characteristics and reliability of the transistor can be improved.

According to one embodiment of the present invention, a semiconductor device which includes an oxide semiconductor, has favorable electric characteristics and reliability, and is easily miniaturized can be provided.

BRIEF DESCRIPTION OF THE DRAWINGS

In the accompanying drawings:

FIGS. 8A and 8B illustrate band structures of oxide semiconductors and a metal material;

DETAILED DESCRIPTION OF THE INVENTION

Figure 1A:
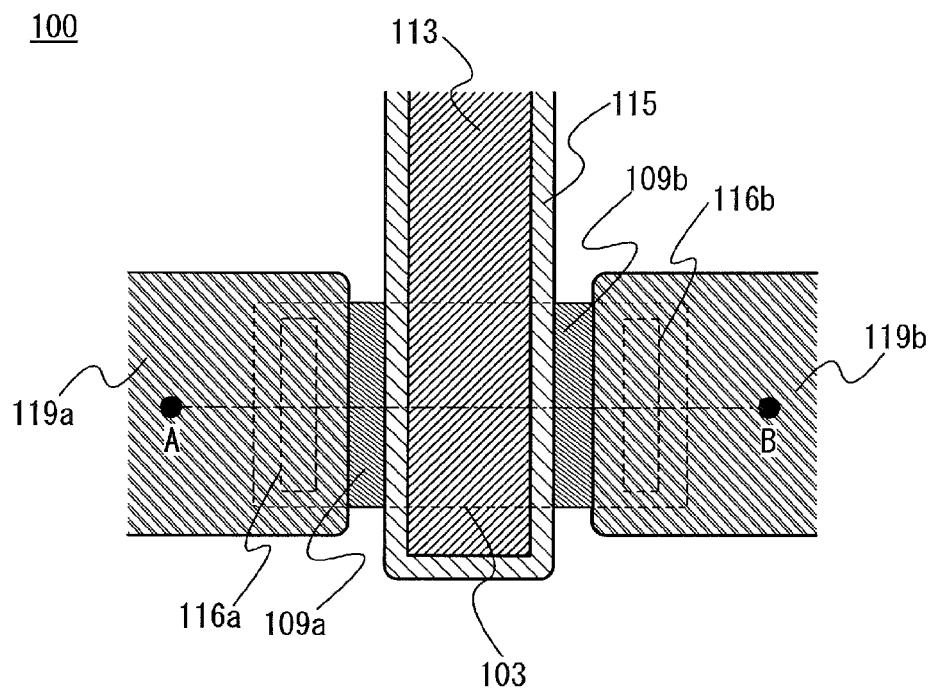
FIGS. 1A and 1B are a top view and a cross-sectional view, respectively, illustrating an example of a semiconductor device which is one embodiment of the present invention.

Embodiments of the present invention will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and description thereof is not repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" may be replaced with each other when the direction of current flow is changed in circuit operation, for example. Therefore, the terms "source" and "drain" can be used to denote the drain and the source, respectively, in this specification.

(Embodiment 1)

In this embodiment, a structure of a transistor which is one embodiment of the present invention and a method for manufacturing the transistor will be described with reference to FIGS. 1A and 1B, FIGS. 2A to 2C, and FIGS. 3A to 3E.

(Structure and Characteristic of Transistor 100)

FIG. 1A is a plan view of a transistor 100. Note that a base insulating film 102, a gate insulating film 111, and an interlayer insulating film 117 are not illustrated in FIG. 1A for convenience.

In FIG. 1A, a first electrode 113 and a sidewall insulating film 115 on side surfaces of the first electrode 113 are provided over an oxide semiconductor film 103. Further, a second electrode 119a and a third electrode 119b are provided over a pair of third regions 109a and 109b in the oxide semiconductor film 103 through openings 116a and 116b. The second electrode 119a and the third electrode 119b are in contact with top surfaces of the pair of third regions 109a and 109b. The transistor 100 is a top-gate top-contact transistor.

Figure 1B:
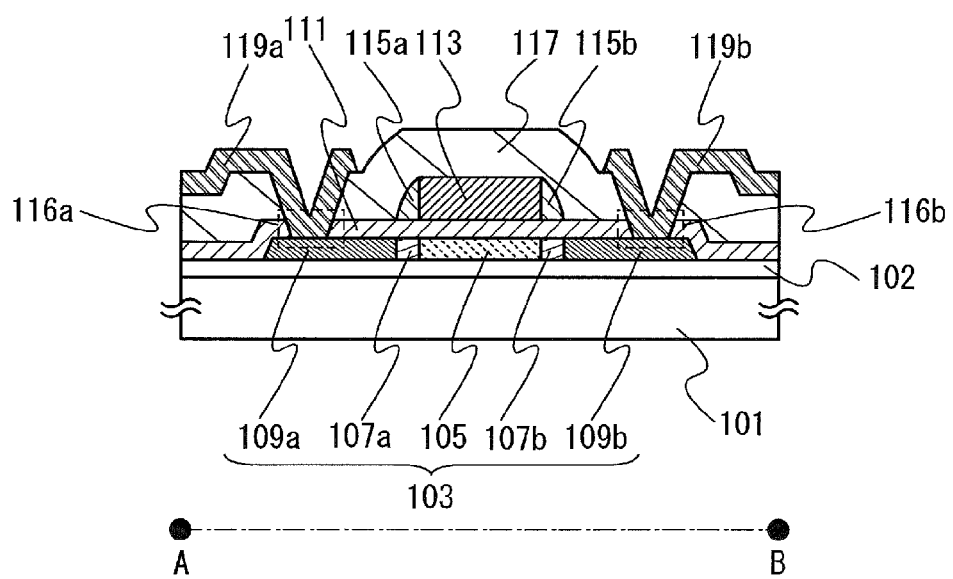

FIG. 1B is a cross-sectional view of the transistor 100 along A-B. In FIG. 1B, the base insulating film 102 is provided over a substrate 101, and the oxide semiconductor film 103 including a first region 105, a pair of second regions 107a and 107b, and the pair of third regions 109a and 109b is provided over the base insulating film 102. The pair of second regions 107a and 107b is provided in contact with side surfaces of the first region 105. The pair of third regions 109a and 109b is provided in contact with side surfaces of the pair of second regions 107a and 107b.

The gate insulating film 111 is provided over the oxide semiconductor film 103. The first electrode 113 which overlaps with the first region 105 is provided over the gate insulating film 111. Sidewall insulating films 115a and 115b (the sidewall insulating film 115) are provided in contact with the side surfaces of the first electrode 113.

The interlayer insulating film 117 is provided over the gate insulating film 111, the first electrode 113, and the sidewall insulating films 115a and 115b.

The second electrode 119a and the third electrode 119b are provided in contact with the pair of third regions 109a and 109b through the opening 116a and 116b provided in the gate insulating film 111 and the interlayer insulating film 117. Note that the gate insulating film 111 is in contact with the first region 105, the pair of second regions 107a and 107b, and the pair of third regions 109a and 109b.

Although end portions of the second electrode 119a and the third electrode 119b may be tapered, the first electrode 113 preferably has a vertical end. The first electrode 113 is formed to have a vertical end, an insulating film to be the sidewall insulating film 115 (the sidewall insulating films 115a and 115b) is formed over the first electrode 113, and highly anisotropic etching is performed; thus, the sidewall insulating film 115 (the sidewall insulating films 115a and 115b) can be formed.

In FIGS. 1A and 1B, the pair of second regions 107a and 107b corresponds to regions where the oxide semiconductor film 103 overlaps with the sidewall insulating film 115, which will be described in detail later. Further, at least part of the sidewall insulating film 115 (the sidewall insulating films 115a and 115b) may be curved except for regions in contact with the side surfaces of the first electrode 113 and the gate insulating film 111.

The oxide semiconductor film 103 including the first region 105, the pair of second regions 107a and 107b, and the pair of third regions 109a and 109b is a metal oxide containing two or more elements selected from In, Ga, Sn, and Zn. Note that the metal oxide has a bandgap greater than or equal to 2 eV, preferably greater than or equal to 2.5 eV, further preferably greater than or equal to 3 eV. The off-state current of the transistor 100 can be reduced by using such a metal oxide having a wide bandgap.

In the transistor 100, the first region 105 functions as a channel formation region.

The first region 105 is the CAAC oxide semiconductor region described above. The CAAC oxide semiconductor is not single crystal, but this does not mean that the CAAC is composed of only an amorphous component. Although the CAAC oxide semiconductor includes a crystallized portion (a crystalline portion), a boundary between one crystalline portion and another crystalline portion is not clear in some cases. Nitrogen may be substituted for part of oxygen included in the CAAC oxide semiconductor. The c-axes of individual crystalline portions included in the CAAC oxide semiconductor may be aligned in one direction (e.g., a direction perpendicular to a surface of a substrate over which the CAAC oxide semiconductor is formed or a surface, a film surface, an interface, or the like of the CAAC oxide semiconductor film). Alternatively, the normals of the a-b planes of the individual crystalline portions included in the CAAC oxide semiconductor may be aligned in one direction (e.g., a direction perpendicular to the substrate surface over which the CAAC oxide semiconductor is formed or the surface, the film surface, the interface, or the like of the CAAC oxide semiconductor film). Note that the CAAC oxide semiconductor can be a conductor, a semiconductor, or an insulator, depending on the composition or the like. Further, the CAAC oxide semiconductor transmits or does not transmit visible light, depending on the composition or the like. As an example of the CAAC oxide semiconductor, a material is given in which triangular or hexagonal atomic arrangement can be observed from the direction perpendicular to a surface of the deposited material, a surface of a substrate over which the material is deposited, or an interface of the deposited material and in which layered arrangement of metal atoms or layered arrangement of metal atoms and oxygen atoms (or nitrogen atoms) can be observed in a cross section of the deposited material.

The hydrogen concentration of the first region 105 is lower than or equal to $1 \times 10^{20}$ atoms/cm$^3$, preferably lower than or equal to $1 \times 10^{19}$ atoms/cm$^3$, further preferably lower than or equal to $1 \times 10^{18}$ atoms/cm$^3$. The transistor 100 in which the first region 105 serving as the channel formation region is the CAAC oxide semiconductor region and the hydrogen concentration is reduced is a highly reliable transistor having stable electric characteristics, because change in the threshold voltage between before and after light irradiation and a gate bias-temperature (BT) stress test is small.

The pair of second regions 107a and 107b and the pair of third regions 109a and 109b each have a conductivity higher than or equal to 10 S/cm and lower than or equal to 1000 S/cm, preferably higher than or equal to 100 S/cm and lower than or equal to 1000 S/cm. Further, the conductivity of the pair of third regions 109a and 109b is higher than the conductivity of the pair of second regions 107a and 107b. Note that when the conductivity is too low, the on-state current of the transistor 100 is decreased.

In addition, the pair of second regions 107a and 107b and the pair of third regions 109a and 109b are each an amorphous region containing a dopant. Hydrogen or one or more elements selected from rare gas elements are added to the pair of second regions 107a and 107b and the pair of third regions 109a and 109b as the dopant.

The carrier density can be increased when the dopant concentrations of the pair of second regions 107a and 107b and the pair of third regions 109a and 109b are increased; however, an excessively high dopant concentration causes the dopant to inhibit transfer of carriers, resulting in decrease in the conductance of the pair of second regions 107a and 107b and the pair of third regions 109a and 109b.

Therefore, it is preferable that the pair of second regions 107a and 107b and the pair of third regions 109a and 109b each have a dopant concentration higher than or equal to $5 \times 10^{18}$ atoms/cm$^3$ and lower than or equal to $1 \times 10^{22}$ atoms/cm$^3$. Further, the dopant concentration of the pair of third regions 109a and 109b is higher than the dopant concentration of the pair of second regions 107a and 107b. Specifically, it is preferable that the dopant concentration of the pair of second regions 107a and 107b be higher than or equal to $5 \times 10^{18}$ atoms/cm$^3$ and lower than $5 \times 10^{19}$ atoms/cm$^3$ and that the dopant concentration of the pair of third regions 109a and 109b be higher than or equal to $5 \times 10^{19}$ atoms/cm$^3$ and lower than or equal to $1 \times 10^{22}$ atoms/cm$^3$. In addition, such a difference in the dopant concentration is made in a self-aligned manner in a step of adding the dopant, because the sidewall insulating film 115 (the sidewall insulating films 115a and 115b) is provided in the transistor 100.

The pair of third regions 109a and 109b functions as a source region and a drain region of the transistor 100. In the transistor 100, amorphous regions having different dopant concentrations (low-concentration regions and high-concentration regions) are provided at both ends of the first region 105 serving as the channel formation region, whereby an electric field applied to the first region 105 serving as the channel formation region can be relieved. Specifically, the pair of second regions 107a and 107b serving as the low-concentration regions and the pair of third regions 109a and 109b serving as the high-concentration regions are provided at both the ends of the first region 105 serving as the channel formation region, whereby an effect in which a band edge of a channel formed in the first region 105 is hardly curved is exhibited in the transistor 100. Accordingly, provision of the pair of second regions 107a and 107b and the pair of third regions 109a and 109b can suppress a short-channel effect.

(Method for Manufacturing Transistor 100)

Next, a method for manufacturing the transistor 100 will be described with reference to FIGS. 2A to 2C and FIGS. 3A to 3E.

The base insulating film 102 is formed over the substrate 101. The base insulating film 102 can be formed by a sputtering method, a CVD method, a coating method, or the like. Note that the thickness of the base insulating film 102 is preferably, but not limited to, 50 nm or more.

There is no particular limitation on a material and the like of the substrate 101 as long as the material has heat resistance high enough to withstand at least heat treatment performed later. For example, a glass substrate, a ceramic substrate, a quartz substrate, or a sapphire substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Further alternatively, any of these substrates provided with a semiconductor element may be used as the substrate 101.

A flexible substrate may also be used as the substrate 101. In the case where a transistor is provided over the flexible substrate, the transistor may be formed directly on the flexible substrate, or the transistor may be formed over a different substrate and then separated from the substrate to be transferred to the flexible substrate. In order to separate the transistor from the substrate and transfer it to the flexible substrate, a region which is easily separated is preferably provided between the different substrate and the transistor.

The base insulating film 102 prevents diffusion of an impurity (e.g., an alkali metal such as Li or Na) from the substrate 101 and etching of the substrate 101 in an etching step in a manufacturing process of the transistor 100.

The base insulating film 102 is formed to have a single-layer structure or a staked-layer structure using any of insulating films selected from oxide insulating films such as a silicon oxide film, a gallium oxide film, and an aluminum oxide film; nitride insulating films such as a silicon nitride film and an aluminum nitride film; a silicon oxynitride film; an aluminum oxynitride film; and a silicon nitride oxide film. Note that the base insulating film 102 preferably contains oxygen in a portion in contact with the oxide semiconductor film 103.

In the case of being formed by a sputtering method, the base insulating film 102 may be formed using a silicon target, a quartz target, an aluminum target, an aluminum oxide target, or the like in an atmosphere gas containing oxygen. The proportion of oxygen in the atmosphere gas is 6 vol. % or higher, preferably 50 vol. % or higher, to the whole atmosphere gas. By increasing the proportion of the oxygen gas in the atmosphere gas, an insulating film from which oxygen is released by heating can be formed.

Hydrogen in the target is preferably removed as much as possible. Specifically, an oxide target including an OH group at 100 ppm or lower, preferably 10 ppm or lower, further preferably 1 ppm or lower is used, whereby the hydrogen concentration in the base insulating film 102 can be reduced and thus the electric characteristics and reliability of the transistor 100 can be improved. For example, fused quartz is preferable because it is easily formed so as to include an OH group at 10 ppm or lower and is inexpensive. Needless to say, a target of synthetic quartz having a low OH group concentration may be used.

Furthermore, in the manufacture of the transistor 100, the content of an alkali metal such as Li or Na, which is an impurity, is preferably low. In the case where a glass substrate containing an impurity such as an alkali metal is used as the substrate 101, the above nitride insulating film is preferably formed as the base insulating film 102 in order to prevent entry of an alkali metal. It is further preferable to stack the above oxide insulating film over the nitride insulating film.

In this specification, silicon oxynitride refers to a substance that contains more oxygen than nitrogen and for example, silicon oxynitride includes oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0 at. % and less than or equal to 10 at. %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above ranges are obtained by measurement using Rutherford backscattering spectrometry (RBS) or hydrogen forward scattering spectrometry (HFS). In addition, the total of the percentages of the constituent elements does not exceed 100 at. %.

In addition, since the base insulating film 102 preferably contains oxygen in a portion in contact with the oxide semiconductor film 103, an insulating film from which oxygen is released by heating may be used as the base insulating film 102. Note that the expression "oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$, in thermal desorption spectroscopy (TDS) analysis.

A method for quantifying the amount of released oxygen which is converted into oxygen atoms, with the use of TDS analysis will be described below.

The amount of released gas in TDS analysis is proportional to the integral value of a spectrum. Therefore, the amount of released gas can be calculated from the ratio of the integral value of a spectrum of an insulating film to the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Numerical Expression 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

[FORMULA 1]

$$N_{O2} = N_{H2}/S_{H2} \times S_{O2} \times \alpha \qquad \text{(Numerical Expression 1)}$$

$N_{H2}$ is the value obtained by conversion of the number of hydrogen molecules desorbed from the standard sample into density. $S_{H2}$ is the integral value of a spectrum of the standard sample which is analyzed by TDS. Here, the reference value of the standard sample is set to $N_{H2}/S_{H2}$. $S_{O2}$ is the integral value of a spectrum of the insulating film which is analyzed by TDS. $\alpha$ is a coefficient which influences spectrum intensity in TDS analysis. Japanese Published Patent Application No. H6-275697 can be referred to for details of Numerical Expression 1. Note that the above value of the amount of released oxygen is obtained by measurement with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen in the case of being converted into oxygen atoms is twice the number of the released oxygen molecules.

As an example of the insulating film from which oxygen is released by heating, oxygen-excess silicon oxide (SiO$_X$ (X>2)) is given. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By using the insulating film from which oxygen is released by heating as the base insulating film 102, oxygen can be supplied to the oxide semiconductor film 103 and interface states between the base insulating film 102 and the oxide semiconductor film 103 can be reduced. Accordingly, electric charge or the like that can be generated owing to operation of the transistor 100 can be prevented from being trapped at the interface between the base insulating film 102 and the oxide semiconductor film 103, and thus the transistor 100 can be a transistor with little deterioration of electric characteristics.

Further, electric charge is generated owing to an oxygen vacancy in the oxide semiconductor film 103 in some cases. In general, when oxygen vacancies are caused in an oxide semiconductor, part of the oxygen vacancies becomes a donor to generate an electron as a carrier. That is, also in the transistor 100, part of oxygen vacancies in the oxide semiconductor film 103 becomes a donor to generate an electron as a carrier and thus the threshold voltage of the transistor 100 is negatively shifted. In addition, the generation of an electron in the oxide semiconductor film 103 often occurs in oxygen vacancies caused in the vicinity of the interface between the oxide semiconductor film 103 and the base insulating film 102. When oxygen is sufficiently released from the base insulating film 102 to the oxide semiconductor film 103, oxygen vacancies in the oxide semiconductor film 103, which might cause the negative shift of the threshold voltage, can be compensated.

That is, by using the insulating film from which oxygen is released by heating as the base insulating film 102, interface states between the oxide semiconductor film 103 and the base insulating film 102 and oxygen vacancies in the oxide semiconductor film 103 can be reduced; thus, an influence of charge trap at the interface between the oxide semiconductor film 103 and the base insulating film 102 can be reduced.

Next, the oxide semiconductor film 103 is formed over the base insulating film 102.

Specifically, an oxide semiconductor film 140 which is an entirely CAAC oxide semiconductor film is formed, and then a dopant is added to the oxide semiconductor film 140, so that the pair of second regions 107a and 107b and the pair of third regions 109a and 109b are formed. In this manner, the oxide semiconductor film 103 is formed. Here, a method for forming the oxide semiconductor film 140 which includes CAAC in the state before the dopant is added to form the pair of second regions 107a and 107b and the pair of third regions 109a and 109b will be described.

There are two methods for forming the oxide semiconductor film 140 which is a CAAC oxide semiconductor film.

One of the methods is a method in which an oxide semiconductor is deposited while a substrate is heated (referred to as a 1-step method for convenience), and the other method is a method in which an oxide semiconductor is deposited twice and heat treatment is performed twice (referred to as a 2-step method for convenience).

Firstly, a method for forming the oxide semiconductor film 140 on the basis of the 1-step method will be described.

First, the oxide semiconductor material given in the description of the oxide semiconductor film 103 is deposited by a sputtering method while the substrate 101 provided with the base insulating film 102 is heated. Note that an oxide semiconductor film formed in this step is referred to as an oxide semiconductor film 130 for convenience. The temperature at which the substrate 101 is heated may be higher than or equal to 200° C. and lower than or equal to 400° C., preferably higher than or equal to 250° C. and lower than or equal to 350° C. The oxide semiconductor film 130 may be formed to a thickness greater than or equal to 1 nm and less than or equal to 50 nm.

Here, a sputtering apparatus used for formation of the oxide semiconductor film 130 will be described in detail below.

The leakage rate of a treatment chamber in which the oxide semiconductor film 130 is formed is preferably lower than or equal to $1 \times 10^{-10}$ Pa·m³/s; thus, entry of an impurity into the film can be suppressed in the formation by a sputtering method.

In order to lower the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m³/s.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member for an inner wall of the treatment chamber, aluminum, chromium, titanium, zirconium, nickel, or vanadium, from which a gas containing hydrogen is less likely to be released, or an alloy material which contains at least one of iron, chromium, nickel, and the like and is covered with any of these elements may be used. The alloy material containing at least one of iron, chromium, nickel, and the like is rigid, resistant to heat, and suitable for processing. Here, when surface unevenness of the member is reduced by polishing or the like to reduce the surface area of the inner wall of the treatment chamber, the released gas can be reduced. Alternatively, the member may be covered with iron fluoride, aluminum oxide, chromium oxide, or the like which is in the passive state.

Furthermore, it is preferable to provide a refiner for an atmosphere gas just in front of the treatment chamber. At this time, the length of a pipe between the refiner and the treatment chamber is less than or equal to 5 m, preferably less than or equal to 1 m. When the length of the pipe is less than or equal to 5 m or less than or equal to 1 m, an influence of the released gas from the pipe can be reduced accordingly.

Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective.

An adsorbate present in the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking may be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

In a sputtering method, an RF power supply device, an AC power supply device, a DC power supply device, or the like can be used as appropriate as a power supply device for generating plasma.

As a target used for forming the oxide semiconductor film 130 by a sputtering method, a metal oxide target containing zinc can be used. Alternatively, a metal oxide target containing two or more elements selected from indium, gallium, tin, and zinc can be used. As the target, for example, any of the following targets can be used: a four-component metal oxide such as an In—Sn—Ga—Zn-based metal oxide; three-component metal oxides such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, and an In—Lu—Zn-based metal oxide; two-component metal oxides such as an In—Zn-based metal oxide, a Sn—Zn-based metal oxide, and an In—Ga-based metal oxide; and a single-component metal oxide containing indium, tin, zinc, or the like.

As an example of the target, a metal oxide target containing In, Ga, and Zn (an In—Ga—Zn-based metal oxide) has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used.

As the atmosphere gas, a rare gas (typically argon) atmosphere, an oxygen atmosphere, or a mixed gas of a rare gas and oxygen is used as appropriate. It is preferable that a high-purity gas from which impurities such as hydrogen, water, hydroxyl, and hydride are removed be used as the atmosphere gas.

With the use of the above sputtering apparatus, the oxide semiconductor film 130 into which entry of hydrogen is suppressed can be formed.

The base insulating film 102 and the oxide semiconductor film 130 may be successively formed in vacuum. For example, after impurities including hydrogen over the surface of the substrate 101 are removed by heat treatment or plasma treatment, the base insulating film 102 may be formed without exposure to the air, and the oxide semiconductor film 130 may be successively formed without exposure to the air. In this manner, impurities including hydrogen over the surface of the substrate 101 can be reduced, and an atmospheric component can be prevented from attaching to the interface between the substrate 101 and the base insulating film 102 and the interface between the base insulating film 102 and the oxide semiconductor film 130. As a result, it is possible to manufacture the transistor 100 having favorable electric characteristics and high reliability.

Then, a resist mask is formed over the oxide semiconductor film 130 in a first photolithography step. Processing is performed using the resist mask in a first etching step, so that an island-shaped oxide semiconductor film 132 is formed. Note that the resist mask can be formed by an ink-jet method, a printing method, or the like as appropriate, as well as through the photolithography step.

In the first etching step, etching is preferably performed so that an end portion of the island-shaped oxide semiconductor film 132 is tapered. The island-shaped oxide semiconductor film 132 is formed to have a tapered end portion, whereby the coverage with the gate insulating film 111 formed later can be improved. In the case of using a photolithography step, the tapered shape can be obtained by etching while removing the resist mask.

The first etching step may be dry etching, wet etching, or combination thereof. As an etchant used for wet etching, a mixed solution of phosphoric acid, acetic acid, and nitric acid, an ammonia hydrogen peroxide mixture (31 wt % hydrogen peroxide water: 28 wt % ammonia water: water=5: 2:2 (volume ratio)), or the like can be used. Alternatively, ITO07N (produced by KANTO CHEMICAL CO., INC.) may be used.

As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

For dry etching, a parallel plate reactive ion etching (RIE) method or an inductively coupled plasma (ICP) etching method can be used. In order to process the film into a desired shape, the etching condition (the amount of electric power applied to a coil-shaped electrode, the amount of electric power applied to an electrode on a substrate side, the temperature of the electrode on the substrate side, or the like) is adjusted as appropriate.

Heat treatment is performed after the oxide semiconductor film 132 is formed, so that the oxide semiconductor film 140 is formed. The heat treatment is performed at a temperature higher than or equal to 150° C. and lower than or equal to 650° C., preferably higher than or equal to 250° C. and lower than or equal to 450° C., in an oxidation atmosphere or an inert atmosphere. Here, the oxidation atmosphere refers to an atmosphere including an oxidation gas such as oxygen, ozone, or nitrogen oxide at 10 ppm or higher. The inert atmosphere refers to an atmosphere which includes the oxidation gas at lower than 10 ppm and is filled with nitrogen or a rare gas. The treatment time is 3 minutes to 24 hours. The ratio of a crystalline region to an amorphous region in the oxide semiconductor film can be increased as the treatment time is increased. Note that heat treatment for longer than 24 hours is not preferable because the productivity is decreased. Note that the heat treatment may be performed after formation of the oxide semiconductor film 132 and the gate insulating film 111.

By the heat treatment, hydrogen is released from the oxide semiconductor film 132, and in addition, part of oxygen contained in the base insulating film 102 is diffused to the oxide semiconductor film 132 and a portion of the base insulating film 102, which is in the vicinity of the interface with the oxide semiconductor film 132.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Here, a method for forming the oxide semiconductor film 140 on the basis of the 2-step method will be described.

A first oxide semiconductor film is formed, and first heat treatment is performed at a temperature higher than or equal to 400° C. and lower than or equal to 750° C. in an atmosphere of nitrogen, oxygen, a rare gas, or dry air. By the first heat treatment, a first crystalline oxide semiconductor film having a crystalline region is formed in a region including a surface of the first oxide semiconductor film. Then, a second oxide semiconductor film which is thicker than the first oxide semiconductor film is formed, and second heat treatment is performed at a temperature higher than or equal to 400° C. and lower than or equal to 750° C., so that crystal growth proceeds upward with the use of the first crystalline oxide semiconductor film as a seed for the crystal growth and the whole second oxide semiconductor film is crystallized (a second crystalline oxide semiconductor film is formed). The first crystalline oxide semiconductor film and the second crystalline oxide semiconductor film, which are formed in the above-described manner, are used as the oxide semiconductor film 130, the first photolithography step and the first etching step are performed so that the oxide semiconductor film 132 is formed, and the heat treatment performed after the formation of the oxide semiconductor film 132 in the 1-step method is performed; thus, the oxide semiconductor film 140 can be formed. Note that a heat treatment apparatus used for the first heat treatment and the second heat treatment may be any of the heat treatment apparatuses which can be used for the heat treatment performed after the formation of the oxide semiconductor film 132 in the 1-step method.

Figure 3A:
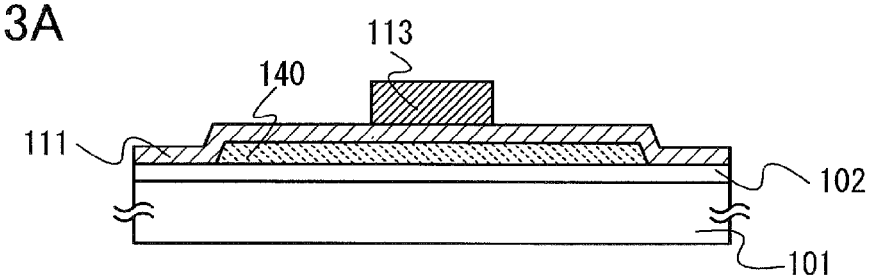
FIGS. 3A to 3E illustrate a method for manufacturing a semiconductor device which is one embodiment of the present invention.

Next, the gate insulating film 111 and the first electrode 113 are formed over the oxide semiconductor film 140 (see FIG. 3A). The gate insulating film 111 can be formed in a manner similar to that of the base insulating film 102. The thickness of the gate insulating film 111 is preferably greater than or equal to 1 nm and less than or equal to 300 nm, further preferably greater than or equal to 5 nm and less than or equal to 50 nm.

The gate insulating film 111 is formed to have a single-layer structure or a stacked-layer structure using any of insulating films selected from a silicon oxide film, a gallium oxide film, an aluminum oxide film, a silicon nitride film, a silicon oxynitride film, an aluminum oxynitride film, and a silicon nitride oxide film. It is preferable that the gate insulating film 111 also contain oxygen in a portion in contact with the oxide semiconductor film 103. Alternatively, an insulating film from which oxygen is released by heating may be used. The insulating film from which oxygen is released by heating is used as the gate insulating film 111, whereby a defect caused in the oxide semiconductor film 103 can be repaired and deterioration of electric characteristics of the transistor 100 can be suppressed.

A high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate ($HfAl_xO_y$ (x>0, y>0)) may be used. Because of high dielectric constant, a high-k material enables increase in the physical thickness of the gate insulating film while maintaining the capacitance of the gate insulating film as the same as the case that, for example, a silicon film is used for the gate insulating film, thereby reducing the gate leakage current. Note that the gate insulating film 111 may have a single-layer structure using the high-k material or a stacked-layer structure using a film of the high-k material and the above insulating film.

For the first electrode 113, a conductive film is formed using any of the above conductive materials by a sputtering method. A second photolithography step is performed to form a resist mask over the conductive film, and then the conductive film is processed using the resist mask in a second etching step; thus, the first electrode 113 is formed. The thickness of the first electrode 113 is not particularly limited and can be determined as appropriate in consideration of the electric resistance of the conductive material used and time for the formation step.

Further, it is preferable that the gate insulating film 111 and the conductive film to be the first electrode 113 be successively formed without exposure to the air.

The first electrode 113 is formed to have a single-layer structure or a stacked-layer structure including, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. Note that the first electrode 113 also functions as a wiring.

Further, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the first electrode 113 and the gate insulating film 111. These films each have a work function of 5 eV or higher, preferably 5.5 eV or higher, and thus the threshold voltage in electric characteristics of the transistor 100 can be positively shifted; consequently, the transistor 100 can be a so-called normally-off transistor. For example, in the case of using an In—Ga—Zn—O film containing nitrogen, an In—Ga—Zn—O film having a higher nitrogen concentration than at least the oxide semiconductor film 140, specifically, an In—Ga—Zn—O film having a nitrogen concentration of 7 at. % or higher is used.

Next, the sidewall insulating films 115*a* and 115*b* are formed. The sidewall insulating film 115 (including the sidewall insulating films 115*a* and 115*b*) is formed using any of the insulating films given in the description of the base insulating film 102 and the gate insulating film 111.

In the transistor 100, the gate insulating film 111 is provided over all of the first region 105, the pair of second regions 107*a* and 107*b*, and the pair of third regions 109*a* and 109*b*. In order to obtain such a structure, the gate insulating film 111 and the sidewall insulating film 115 (including the sidewall insulating films 115*a* and 115*b*) may be formed using insulating films having different etching rates. With such a structure, the gate insulating film 111 can function as an etching stopper in formation of the sidewall insulating film 115. By using the gate insulating film 111 as an etching stopper, excessive etching of the oxide semiconductor film 140 can be suppressed. Moreover, an end point of the etching for forming the sidewall insulating film 115 can be easily detected. In addition, when the gate insulating film 111 functions as an etching stopper, the width of the sidewall insulating film 115 (the widths of portions where the sidewall insulating films 115*a* and 115*b* are in contact with the gate insulating film 111 in FIG. 1B) can be easily controlled. The area of the pair of second regions 107*a* and 107*b* serving as the low-concentration regions is determined in accordance with the width of the sidewall insulating film 115 (the widths of the portions where the sidewall insulating films 115*a* and 115*b* are in contact with the gate insulating film 111 in FIG. 1B). As the area of the low-concentration regions is increased, an electric field applied to the first region 105 functioning as the channel formation region can be further relieved.

Figure 3B:
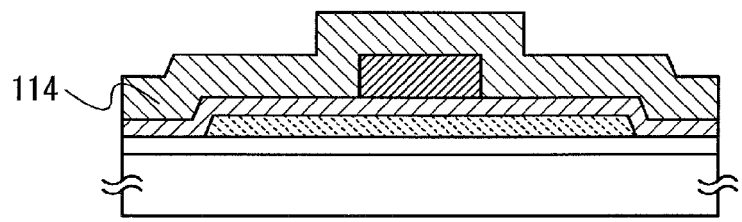
Figure 3C:
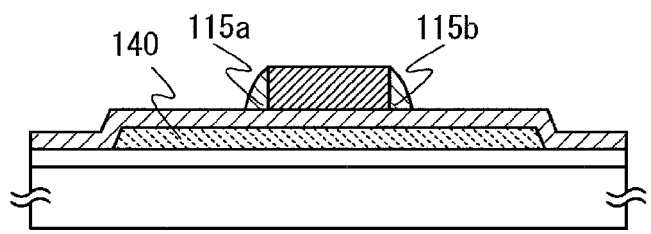

First, an insulating film 114 to be the sidewall insulating films 115*a* and 115*b* is formed over the gate insulating film 111 and the first electrode 113 (see FIG. 3B). The insulating film 114 can be formed in a manner similar to that of the base insulating film 102 and is formed using any of the insulating films listed above. There is no particular limitation on the thickness of the insulating film 114. The insulating film 114 is subjected to a third etching step, so that the sidewall insulating films 115*a* and 115*b* are formed (see FIG. 3C). The third etching step is highly anisotropic etching, and the sidewall insulating films 115*a* and 115*b* can be formed in a self-aligned manner by performing the highly anisotropic etching step on the insulating film 114. Here, dry etching is preferably employed as the highly anisotropic etching, and a gas containing fluorine such as trifluoromethane ($CHF_3$), octafluorocyclobutane ($C_4F_8$), or tetrafluoromethane ($CF_4$) can be used as an etching gas, for example. A rare gas such as helium (He) or argon (Ar) or hydrogen ($H_2$) may be added to the etching gas. In addition, as the dry etching, a reactive ion etching method (an RIE method) in which high-frequency voltage is applied to a substrate is preferably used.

Further, the dopant concentration of the pair of second regions 107*a* and 107*b* depends on the thicknesses of the sidewall insulating films 115*a* and 115*b*; therefore, the thicknesses of the sidewall insulating films 115*a* and 115*b* and the thickness of the first electrode 113 may be determined so that the dopant concentration of the pair of second regions 107*a* and 107*b* is within the above range. Note that the thickness of the sidewall insulating film 115*a* or 115*b* here means the length from a plane thereof which is in contact with the gate insulating film 111 to the highest point of a plane thereof which is in contact with the first electrode 113.

In addition, the area of the pair of second regions 107*a* and 107*b* serving as the low-concentration regions is determined in accordance with the width of the sidewall insulating film 115 (here, the widths of the portions where the sidewall insulating films 115*a* and 115*b* are in contact with the gate insulating film 111 in FIG. 1B). Furthermore, the width of the sidewall insulating film 115 depends on the thickness of the first electrode 113; therefore, the thickness of the first electrode 113 may be determined so that the pair of second regions 107*a* and 107*b* has a desired area.

Figure 3D:
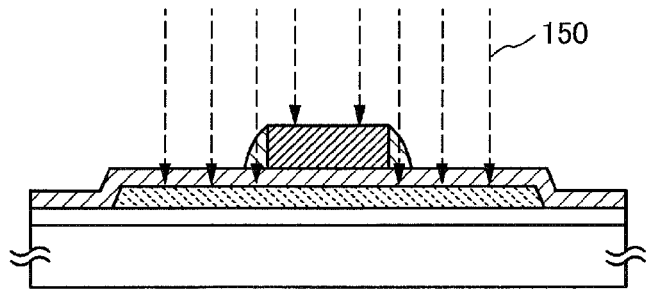
Figure 3E:
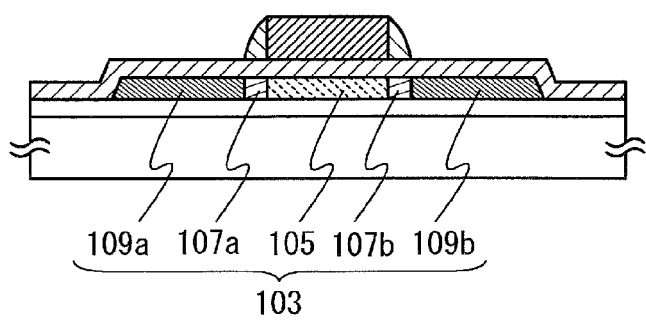

Next, treatment for adding a dopant 150 to the oxide semiconductor film 140 is performed, so that the oxide semiconductor film 103 is formed (see FIG. 3D).

The dopant 150 added is hydrogen or one or more elements selected from rare gas elements. As a method for adding the dopant 150 to the oxide semiconductor film 140, an ion doping method or an ion implantation method can be used. When an ion doping method or an ion implantation method is used, the depth to which the dopant 150 is added (an addition region) can be easily controlled and thus the dopant 150 can be added to the oxide semiconductor film 140 with high accuracy. The dopant 150 may be added by an ion doping method or an ion implantation method while the substrate 101 is heated. Furthermore, instead of performing ion doping or ion implantation, the dopant can be added by generating plasma in an atmosphere of a gas containing the dopant added and performing plasma treatment on an object to which the dopant is added.

Hydrogen serves as an electron donor in the oxide semiconductor film 140 and causes the oxide semiconductor film 140 to have n-type conductivity. A rare gas element forms a defect in the oxide semiconductor film 140 and causes the oxide semiconductor film 140 to have n-type conductivity. Since hydrogen easily diffuses, diffusion of hydrogen to the first region 105 serving as the channel formation region might cause deterioration of transistor characteristics. For this reason, a rare gas element is preferably used as the dopant 150.

In addition, in the case where an element with a large atomic radius, such as a rare gas element, is added as the dopant 150, it is preferable that the above plasma treatment be performed with the gate insulating film provided over the first region, the pair of second regions, and the pair of third regions. For example, in the transistor 100, if the above plasma treatment is performed with the pair of third regions 109*a* and 109*b* serving as the source region and the drain region exposed, portions of the oxide semiconductor film 140 to be the pair of third regions 109*a* and 109*b* might be etched and decreased in thickness. By performing the plasma treatment with the gate insulating film 111 provided over the first region 105, the pair of second regions 107*a* and 107*b*, and the pair of third regions 109*a* and 109*b*, the gate insulating film 111 can prevent etching of the portions of the oxide semiconductor film 140 to be the pair of third regions 109*a* and 109*b* and suppress the decrease in thickness. In addition, cleanliness of the interface between the oxide semiconductor film 103 and the gate insulating film 111 can be maintained, and thus the electric characteristics and reliability of the transistor 100 can be improved.

In the addition of the dopant 150 to the oxide semiconductor film 140, the dopant 150 is added to the oxide semiconductor film 140 through the gate insulating film 111 and the sidewall insulating films 115a and 115b. Further, in the oxide semiconductor film 140, the amount of the added dopant 150 is smaller in a region to which the dopant 150 is added through the gate insulating film 111 and the sidewall insulating film 115a or 115b than in a region to which the dopant 150 is added through only the gate insulating film 111. Thus, the pair of second regions 107a and 107b and the pair of third region 109a and 109b are formed in a self-aligned manner (see FIG. 3E). Note that the dopant 150 is not added to a region of the oxide semiconductor film 140, which overlaps with the first electrode 113.

Further, the pair of second regions 107a and 107b and the pair of third regions 109a and 109b get lower crystallinity because of damage due to the addition of the dopant 150 and become amorphous regions. Note that by adjusting the additive amount of the dopant 150 or the like, the degree of damage can be reduced so that the pair of second regions 107a and 107b and the pair of third regions 109a and 109b are prevented from becoming completely amorphous. In that case, the pair of second regions 107a and 107b and the pair of third regions 109a and 109b each have at least a higher proportion of an amorphous region than the first region 105.

Further, heat treatment may be performed after the dopant 150 is added. The heat treatment may be performed in a manner similar to that of the heat treatment performed in the formation of the oxide semiconductor film 140, and is preferably performed at a temperature at which the pair of second regions 107a and 107b and the pair of third regions 109a and 109b are not crystallized.

Note that the treatment for adding the dopant 150 to the oxide semiconductor film 140 may be performed plural times. In the case where the treatment for adding the dopant 150 to the oxide semiconductor film 140 is performed plural times, the kind of the dopant 150 may be the same in the plural treatments or different in every treatment. For example, treatment may be performed in the following order: the first electrode 113 is formed as in FIG. 3A, treatment for adding the dopant 150 (first addition treatment) is performed, the sidewall insulating films 115a and 115b are formed, and treatment for adding the dopant 150 (second addition treatment) is performed. The dopant 150 may be the same element or different elements in the first addition treatment and the second addition treatment.

Next, an insulating film to be the interlayer insulating film 117 is formed over the gate insulating film 111, the sidewall insulating films 115a and 115b, and the first electrode 113, and a third photolithography step and a fourth etching step are performed on the insulating film and the gate insulating film 111, so that the openings 116a and 116b are formed. The third photolithography step and the fourth etching step may be similar to the first photolithography step and the first etching step.

The interlayer insulating film 117 may be formed using a silicon oxide film, a silicon oxynitride film, a silicon nitride oxide film, or a silicon nitride film by a sputtering method, a CVD method, or the like. At this time, a film from which oxygen is less likely to be released by heating is preferably used as the interlayer insulating film 117 in order to prevent decrease in the conductivity of the pair of second regions 107a and 107b and the pair of third regions 109a and 109b. Specifically, the interlayer insulating film 117 may be formed by a CVD method with the use of a mixture which includes a silane gas as a main material and a proper source gas selected from a nitrogen oxide gas, a nitrogen gas, a hydrogen gas, and a rare gas. In addition, the substrate temperature may be higher than or equal to 300° C. and lower than or equal to 550° C. By using a CVD method, the film from which oxygen is less likely to be released by heating can be formed.

Next, the second electrode 119a and the third electrode 119b are formed to be connected to the pair of third regions 109a and 109b through the openings 116a and 116b (see FIG. 1B).

Each of the second electrode 119a and the third electrode 119b also functions as a wiring and is formed using any of the materials given in the description of the first electrode 113.

In the transistor 100, the pair of third regions 109a and 109b in contact with the second electrode 119a and the third electrode 119b is regions having high conductivity, to which the dopant is added; therefore, the contact resistance between the second electrode 119a and the third region 109a and between the third electrode 119b and the third region 109b can be reduced. Accordingly, the on-state current of the transistor 100 can be increased.

The second electrode 119a and the third electrode 119b are formed in such a manner that a conductive film is formed using any of the above conductive materials as in the case of the first electrode 113 and is then subjected to a fourth photolithography step and a fifth etching step. Note that the fourth photolithography step and the fifth etching step may be similar to the first photolithography step and the first etching step.

Through the above steps, the transistor 100 can be manufactured.

As described above, according to one embodiment of the disclosed invention, a problem due to miniaturization can be solved. As a result, the size of the transistor can be sufficiently reduced. When the size of the transistor is sufficiently reduced, the area occupied by a semiconductor device is also reduced and thus the number of semiconductor devices manufactured from one substrate is increased. Accordingly, manufacturing cost of the semiconductor device is reduced. Further, the size of the semiconductor device can be reduced with its function maintained; therefore, the semiconductor device can have improved functions as compared with a conventional one of the same size. Further, effects such as high-speed operation, low power consumption, and the like can be obtained because of reduction in channel length. Thus, miniaturization of a transistor including an oxide semiconductor can be achieved according to one embodiment of the disclosed invention, and various effects accompanied with the miniaturization can be obtained. Note that this embodiment can be combined with any of the other embodiments as appropriate.

(Embodiment 2)

In this embodiment, a transistor 200 having a structure which is partly different from the structure of the transistor 100 described in Embodiment 1 will be described.

(Structure and Characteristic of Transistor 200)

The transistor 200 is a transistor which includes a gate insulating film having a shape different from that of the gate insulating film 111 of the transistor 100.

Figure 4A:
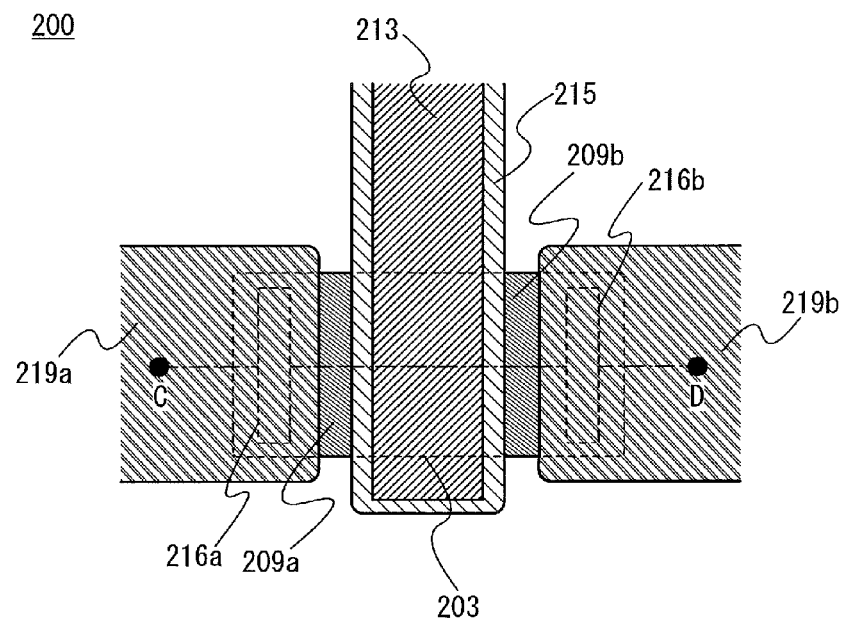
FIGS. 4A and 4B are a top view and a cross-sectional view, respectively, illustrating an example of a semiconductor device which is one embodiment of the present invention.

FIG. 4A is a plan view of the transistor 200. Note that a base insulating film 202, a gate insulating film 211, and an interlayer insulating film 217 are not illustrated in FIG. 4A for convenience.

In FIG. 4A, a first electrode 213 and a sidewall insulating film 215 on side surfaces of the first electrode 213 are provided over an oxide semiconductor film 203. Further, a second electrode 219a and a third electrode 219b are provided over third regions 209a and 209b in the oxide semiconductor film 203 through openings 216a and 216b. The second electrode 219a and the third electrode 219b are in contact with top surfaces of the third regions 209a and 209b. The transistor 200 is a top-gate top-contact transistor.

Figure 4B:
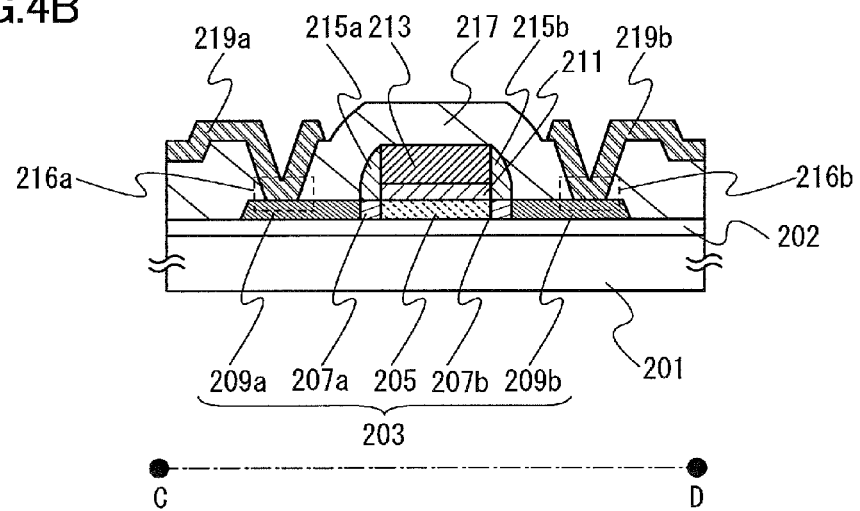

FIG. 4B is a cross-sectional view of the transistor 200 along C-D. In FIG. 4B, the base insulating film 202 is provided over a substrate 201, and the oxide semiconductor film 203 including a first region 205, a pair of second regions 207a and 207b, and the pair of third regions 209a and 209b is provided over the base insulating film 202. The pair of second regions 207a and 207b is provided in contact with side surfaces of the first region 205. The pair of third regions 209a and 209b is provided in contact with side surfaces of the pair of second regions 207a and 207b.

The gate insulating film 211 is provided over the oxide semiconductor film 203. The gate insulating film 211 is in contact with the first region 205. The first electrode 213 which overlaps with the first region 205 is provided over the gate insulating film 211. Sidewall insulating films 215a and 215b are provided in contact with the side surfaces of the first electrode 213.

The second electrode 219a and the third electrode 219b are in contact with the top surfaces of the pair of third regions 209a and 209b through the openings 216a and 216b in the interlayer insulating film 217 which is provided over the first electrode 213 and the sidewall insulating films 215a and 215b.

Although end portions of the second electrode 219a and the third electrode 219b may be tapered, the first electrode 213 preferably has a vertical end. The first electrode 213 is formed to have a vertical end, an insulating film to be the sidewall insulating film 215 (the sidewall insulating films 215a and 215b) is formed over the first electrode 213, and highly anisotropic etching is performed; thus, the sidewall insulating film 215 (the sidewall insulating films 215a and 215b) can be formed.

In FIG. 4A, the second regions 207a and 207b correspond to regions where the oxide semiconductor film 203 overlaps with the sidewall insulating film 215. Further, at least part of the sidewall insulating film 215 is curved except for regions in contact with the side surfaces of the first electrode 213 and the gate insulating film 211.

In the transistor 100, since the gate insulating film 111 is in contact with the first region 105, the pair of second regions 107a and 107b, and the pair of third regions 109a and 109b, the openings 116a and 116b are provided in the gate insulating film 111 and the interlayer insulating film 117. In contrast, in the transistor 200, since the gate insulating film 211 is only in contact with the first region 205, the openings 216a and 216b are provided only in the interlayer insulating film 217.

In the transistor 200, the gate insulating film 211 is in contact with the first region 205, and the gate insulating film 211 does not follow the shape of (does not cover a step formed by) the oxide semiconductor film 203. In other words, the gate insulating film 211 does not have a portion which extends beyond a step formed by the oxide semiconductor film 203. The gate insulating film 211 does not have a portion which extends beyond a step formed by the oxide semiconductor film 203, which contributes to reduction in the leakage current of the transistor 200 due to the gate insulating film 211 and increase in the withstand voltage of the gate insulating film 211. Therefore, even when the gate insulating film 211 whose thickness is reduced to around 5 nm is used, the transistor can operate. Note that reduction in the thickness of the gate insulating film 211 leads to suppression of a short-channel effect and increase in the operation speed of the transistor.

Moreover, in the transistor 200, since the gate insulating film 211 does not have a portion which extends beyond a step, parasitic capacitance is hardly caused between the first electrode 213 and the pair of second regions 207a and 207b and between the first electrode 213 and the pair of third regions 209a and 209b. Consequently, even when the channel length of the transistor 200 is shortened, fluctuation in the threshold voltage can be reduced.

(Method for Manufacturing Transistor 200)

Next, a method for manufacturing the transistor 200 will be described with reference to FIGS. 2A to 2C and FIGS. 5A to 5E.

Figure 2A:
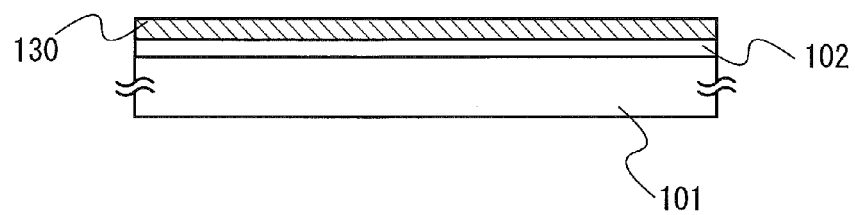
FIGS. 2A to 2C illustrate a method for manufacturing a semiconductor device which is one embodiment of the present invention.
Figure 2B:
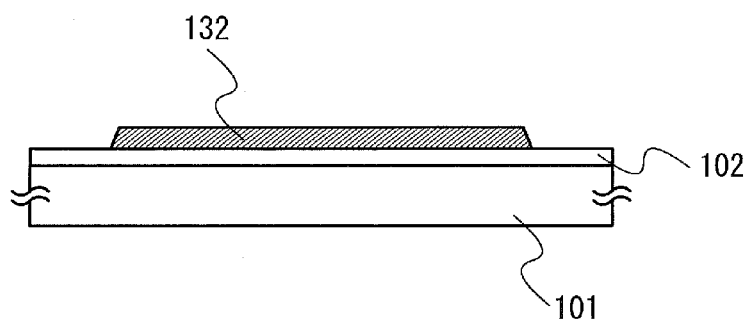
Figure 2C:
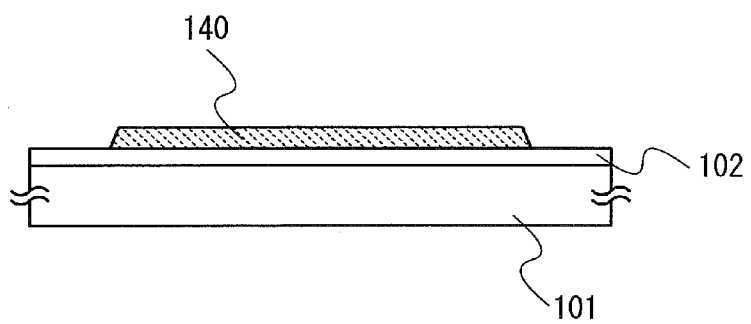

In the method for manufacturing the transistor 200, steps preceding a step of forming the insulating film 210 which becomes the gate insulating film 211 (steps up to and including a step of forming the oxide semiconductor film 140 in FIGS. 2A to 2C) are the same as those of the transistor 100; thus, Embodiment 1 can be referred to (see FIGS. 2A to 2C). Note that the substrate 201 and the base insulating film 202 may have the same structures as the substrate 101 and the base insulating film 102 described in Embodiment 1.

Next, an insulating film 210 is formed over the oxide semiconductor film 140. The insulating film 210 is formed using a material which can be used for the gate insulating film 111 in Embodiment 1. Then, a conductive film 212 to be the first electrode 213 is formed over the insulating film 210 (see FIG. 5A). The conductive film 212 is formed using a conductive material which can be used for the first electrode 113 described in Embodiment 1. Note that as a method for forming the conductive film 212, a sputtering method may be used as in Embodiment 1.

Further, it is preferable that the insulating film 210 and the conductive film 212 be successively formed without exposure to the air.

The insulating film 210 and the conductive film 212 are processed, so that the gate insulating film 211 and the first electrode 213 are formed. By this processing, the gate insulating film 211 which has a shape different from that of the gate insulating film 111 of the transistor 100 can be formed. Note that the insulating film 210 and the conductive film 212 may be processed using the photolithography step and the etching step described in Embodiment 1 as appropriate. The thickness of the gate insulating film 211 may be determined as appropriate on the basis of the description in Embodiment 1.

Figure 5A:
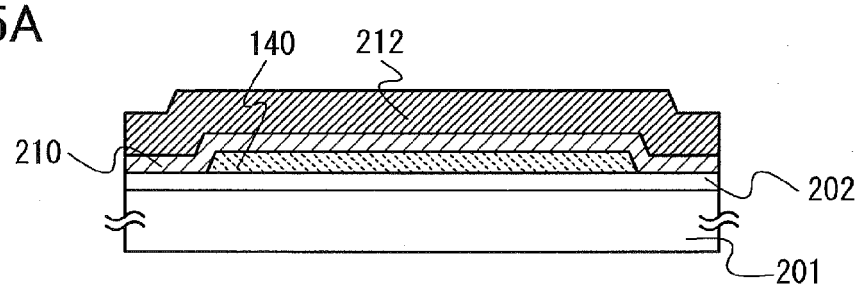
FIGS. 5A to 5E illustrate a method for manufacturing a semiconductor device which is one embodiment of the present invention.
Figure 5B:
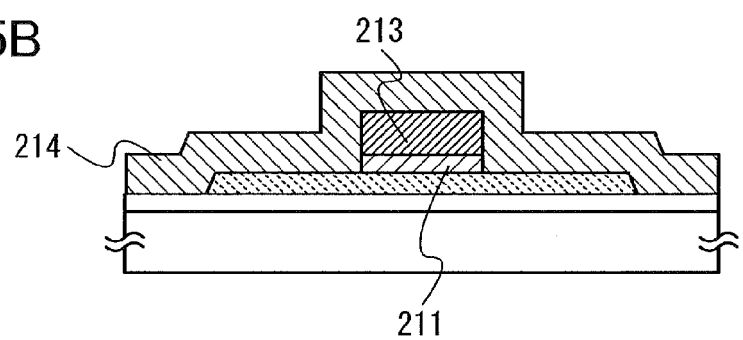
Figure 5C:
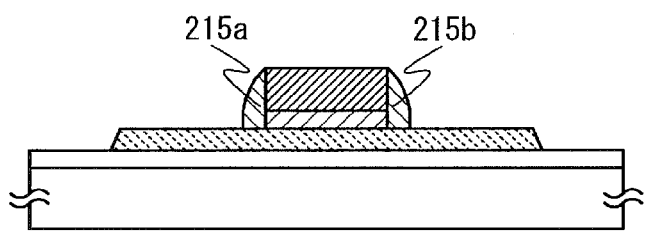

Next, an insulating film 214 to be the sidewall insulating films 215a and 215b is formed over the oxide semiconductor film 140, the gate insulating film 211, and the first electrode 213 (see FIG. 5B). The insulating film 214 is formed using a material which can be used for the base insulating film 102 in Embodiment 1. After that, the insulating film 214 is processed, so that the sidewall insulating films 215a and 215b are formed (see FIG. 5C). A method for processing the insulating film 214 into the sidewall insulating films 215a and 215b may be the same as the method for processing the insulating film 114 into the sidewall insulating films 115a and 115b, which is described in Embodiment 1.

The thickness of the sidewall insulating film 215a or 215b means the length from a plane thereof which is in contact with the oxide semiconductor film 140 to be the oxide semiconductor film 203 later to the highest point of a plane thereof which is in contact with the first electrode 213. Further, the dopant concentration of the pair of second regions 207a and 207b formed later depends on the thicknesses of the sidewall insulating films 215a and 215b; therefore, the thicknesses of the sidewall insulating films 215a and 215b and the thickness of the first electrode 213 may be determined so that the dopant concentration of the pair of second regions 207a and 207b is within the range described in Embodiment 1.

In addition, the area of the pair of second regions 207a and 207b serving as low-concentration regions is determined in accordance with the width of the sidewall insulating film 215 (here, the widths of portions where the sidewall insulating films 215a and 215b are in contact with the oxide semiconductor film 203 in FIG. 4B). As the area of the low-concentration regions is increased, an electric field applied to the first region 205 functioning as a channel formation region can be further relieved. The width of the sidewall insulating film 215 depends on the thickness of the first electrode 213; therefore, the thickness of the first electrode 213 may be determined so that the pair of second regions 207a and 207b has a desired area.

Figure 5D:
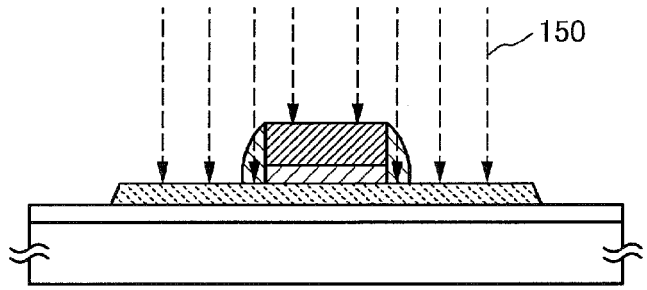
Figure 5E:
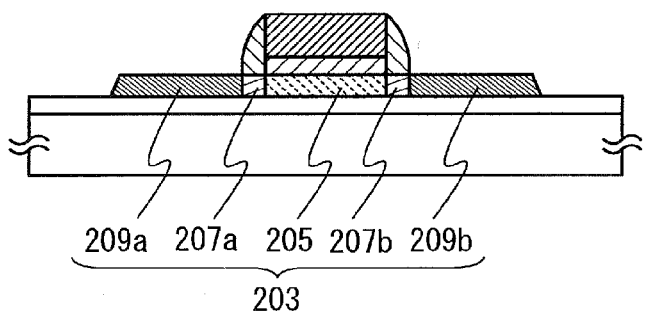

Next, treatment for adding the dopant 150 to the oxide semiconductor film 140 is performed (see FIG. 5D). The treatment for adding the dopant 150 to the oxide semiconductor film 140 may be performed as in Embodiment 1. By this treatment, the first region 205, the pair of second regions 207a and 207b, and the pair of third regions 209a and 209b are formed (see FIG. 5E). Note that the first region 205, the pair of second regions 207a and 207b, and the pair of third regions 209a and 209b which are formed by this treatment have structures similar to those of the first region 105, the pair of second regions 107a and 107b, and the pair of third regions 109a and 109b described in Embodiment 1.

Further, the dopant 150 can be added by a method other than an injection method such as an ion doping method or an ion implantation method. For example, plasma treatment can be given in which plasma is generated in an atmosphere of a gas containing the dopant and an object to which the dopant is added (here, the oxide semiconductor film 140) is irradiated with the plasma. As an apparatus for generating the plasma, a dry etching apparatus, a plasma CVD apparatus, a high-density plasma CVD apparatus, or the like can be used. Note that the plasma treatment may be performed while the substrate 201 is heated.

In the case where portions of the oxide semiconductor film 140 to be the pair of third regions 209a and 209b are exposed as in the transistor 200, if a rare gas element is added as the dopant by plasma treatment, the portions to be the pair of third regions 209a and 209b might be etched and decreased in thickness as described in Embodiment 1. Therefore, in the case where the portions of the oxide semiconductor film 140 to be the pair of third regions 209a and 209b are exposed, hydrogen is preferably used as the dopant.

Note that the treatment for adding the dopant 150 to the oxide semiconductor film 140 can be performed plural times as in Embodiment 1.

Further, heat treatment may be performed after the dopant 150 is added. The heat treatment may be performed in a manner similar to that of the heat treatment performed in the formation of the oxide semiconductor film 140, and is preferably performed at a temperature at which the pair of second regions 207a and 207b and the pair of third regions 209a and 209b are not crystallized.

The interlayer insulating film 217, the openings 216a and 216b, the second electrode 219a, and the third electrode 219b may be formed in manners similar to those of the interlayer insulating film 117, the openings 116a and 116b, the second electrode 119a, and the third electrode 119b described in Embodiment 1. Through the above steps, the transistor 200 can be manufactured (see FIG. 4B).

The transistor 200 described in this embodiment can achieve an effect similar to that in Embodiment 1. Note that this embodiment can be combined with any of the other embodiments as appropriate.

(Embodiment 3)

In this embodiment, a transistor 300 having a structure which is partly different from the structure of the transistor described in the above embodiment will be described.

(Structure and Characteristic of Transistor 300)

Which surfaces of a second electrode and a third electrode are in contact with a pair of third regions differs between the transistor 300 and the transistor 200.

Figure 6A:
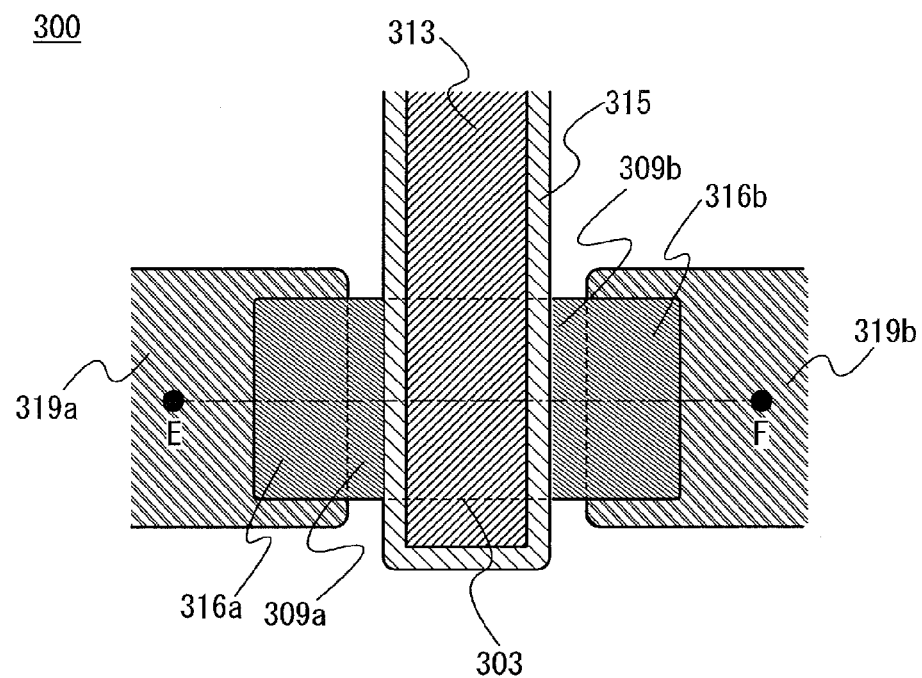
FIGS. 6A and 6B are a top view and a cross-sectional view, respectively, illustrating an example of a semiconductor device which is one embodiment of the present invention.

FIG. 6A is a plan view of the transistor 300. Note that a base insulating film 302, a gate insulating film 311, and an interlayer insulating film 317 are not illustrated in FIG. 6A for convenience.

In FIG. 6A, a first electrode 313 and a sidewall insulating film 315 on side surfaces of the first electrode 313 are provided over an oxide semiconductor film 303. Further, a second electrode 319a and a third electrode 319b are in contact with bottom surfaces of third regions 309a and 309b in the oxide semiconductor film 303. The transistor 300 is a top-gate bottom-contact transistor.

Figure 6B:
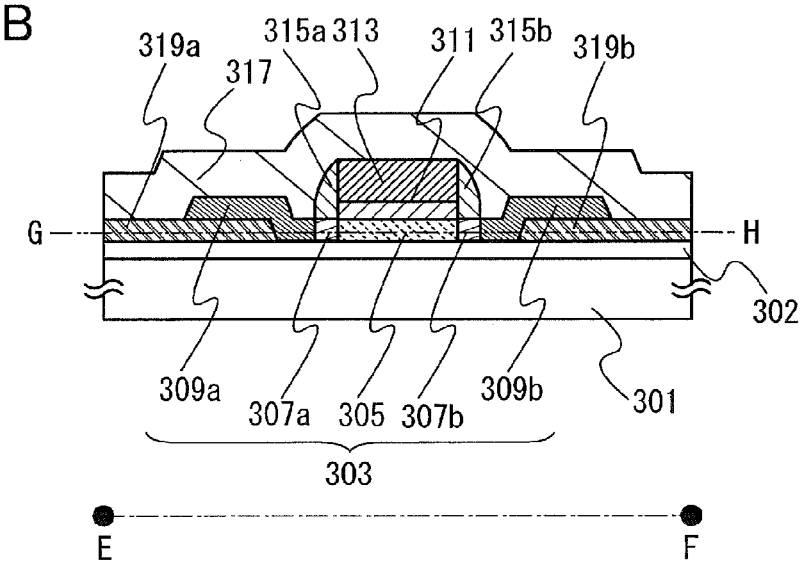

FIG. 6B is a cross-sectional view of the transistor 300 along E-F. In FIG. 6B, the base insulating film 302 is provided over a substrate 301, and the oxide semiconductor film 303 including a first region 305, a pair of second regions 307a and 307b, and the pair of third regions 309a and 309b, the second electrode 319a, and the third electrode 319b are provided over the base insulating film 302. The pair of second regions 307a and 307b is provided in contact with side surfaces of the first region 305. The pair of third regions 309a and 309b is provided in contact with side surfaces of the pair of second regions 307a and 307b.

The gate insulating film 311 is provided over the oxide semiconductor film 303. The gate insulating film 311 is in contact with the first region 305. The first electrode 313 which overlaps with the first region 305 is provided over the gate insulating film 311. Sidewall insulating films 315a and 315b are provided in contact with the side surfaces of the first electrode 313.

The interlayer insulating film 317 is provided over the gate insulating film 311, the first electrode 313, and the sidewall insulating films 315a and 315b.

Although end portions of the second electrode 319a and the third electrode 319b may be tapered, the first electrode 313 preferably has a vertical end. The first electrode 313 is formed to have a vertical end, an insulating film to be the sidewall insulating film 315 (the sidewall insulating films 315a and 315b) is formed over the first electrode 313, and highly anisotropic etching is performed; thus, the sidewall insulating film 315 (the sidewall insulating films 315a and 315b) can be formed.

In FIG. 6A, the second regions 307a and 307b correspond to regions where the oxide semiconductor film 303 overlaps with the sidewall insulating film 315. Further, at least part of the sidewall insulating film 315 is curved except for regions in contact with the side surfaces of the first electrode 313 and the gate insulating film 311.

In the transistor 300, the gate insulating film 311 is in contact with the first region 305, and the gate insulating film 311 does not follow the shape of (does not cover a step formed by) the oxide semiconductor film 303. In other words, the gate insulating film 311 does not have a portion which extends beyond a step formed by the oxide semiconductor film 303. The gate insulating film 311 does not have a portion which extends beyond a step formed by the oxide semiconductor film 303, which contributes to reduction in the leakage current of the transistor 300 due to the gate insulating film 311 and increase in the withstand voltage of the gate insulating film 311. Therefore, even when the gate insulating film 311 whose thickness is reduced to around 5 nm is used, the transistor can operate. Note that reduction in the thickness of the gate insulating film 311 leads to suppression of a short-channel effect and increase in the operation speed of the transistor.

Moreover, in the transistor 300, since the gate insulating film 311 does not have a portion which extends beyond a step, parasitic capacitance is hardly caused between the first electrode 313 and the pair of second regions 307a and 307b and between the first electrode 313 and the pair of third regions 309a and 309b. Consequently, even when the channel length of the transistor 300 is shortened, fluctuation in the threshold voltage can be reduced.

The transistor 300 illustrated in FIGS. 6A and 6B has a structure in which the gate insulating film 311 is provided only in a region in contact with the first electrode 313; however, the gate insulating film 311 may also be provided over the third regions 309a and 309b (and further over the second electrode 319a and the third electrode 319b) as in Embodiment 1.

(Method for Manufacturing Transistor 300)

Next, a method for manufacturing the transistor 300 will be described with reference to FIGS. 7A to 7E.

The base insulating film 302 is formed over the substrate 301; then, a conductive film to be the second electrode 319a and the third electrode 319b is formed over the base insulating film 302 and the conductive film is processed, so that the second electrode 319a and the third electrode 319b are formed. The substrate 301 and the base insulating film 302 may have the same structures as the substrate 101 and the base insulating film 102 described in Embodiment 1. The conductive film is formed using a conductive material which can be used for the second electrode 119a and the third electrode 119b described in Embodiment 1. Note that as a method for forming the conductive film, a sputtering method may be used as in Embodiment 1. In addition, the conductive film may be processed using the photolithography step and the etching step described in Embodiment 1 as appropriate.

Figure 7A:
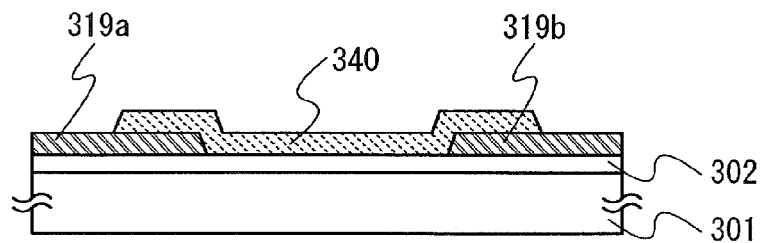
FIGS. 7A to 7E illustrate a method for manufacturing a semiconductor device which is one embodiment of the present invention.

An oxide semiconductor film 340 is formed over the base insulating film 302, the second electrode 319a, and the third electrode 319b (see FIG. 7A). The oxide semiconductor film 340 can be formed in a manner similar to that of the oxide semiconductor film 140 described in Embodiment 1 (see FIGS. 2A to 2C).

Next, the gate insulating film 311 and the first electrode 313 are formed over the second electrode 319a, the third electrode 319b, and the oxide semiconductor film 340. First, an insulating film to be the gate insulating film 311 is formed over the oxide semiconductor film 340. The gate insulating film 311 and the first electrode 313 may be formed in manners similar to those of the gate insulating film 211 and the first electrode 213 in Embodiment 2.

Figure 7B:
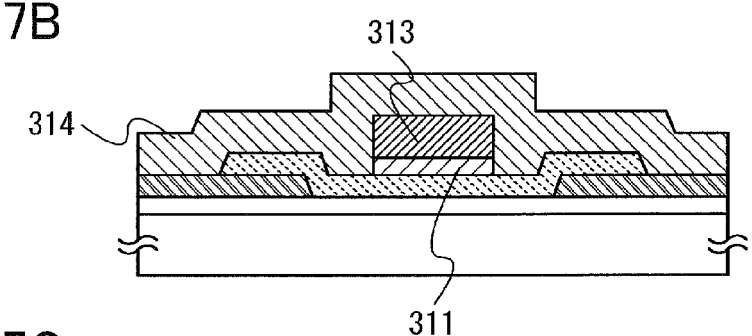
Figure 7C:
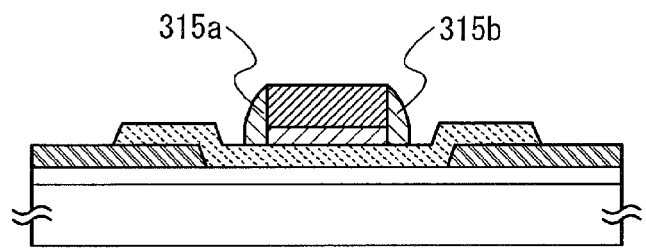

Next, an insulating film 314 to be the sidewall insulating films 315a and 315b is formed over the oxide semiconductor film 340, the gate insulating film 311, and the first electrode 313 (see FIG. 7B). The insulating film 314 is formed using a material which can be used for the base insulating film 102 in Embodiment 1. After that, the insulating film 314 is processed, so that the sidewall insulating films 315a and 315b are formed (see FIG. 7C). A method for processing the insulating film 314 into the sidewall insulating films 315a and 315b may be the same as the method for processing the insulating film 114 into the sidewall insulating films 115a and 115b, which is described in Embodiment 1.

The thickness of the sidewall insulating film 315a or 315b means the length from a plane thereof which is in contact with the oxide semiconductor film 340 to be the oxide semiconductor film 303 later to the highest point of a plane thereof which is in contact with the first electrode 313. Further, the dopant concentration of the pair of second regions 307a and 307b formed later depends on the thicknesses of the sidewall insulating films 315a and 315b; therefore, the thicknesses of the sidewall insulating films 315a and 315b and the thickness of the first electrode 313 may be determined so that the dopant concentration of the pair of second regions 307a and 307b is within the range described in Embodiment 1.

In addition, the area of the pair of second regions 307a and 307b serving as low-concentration regions is determined in accordance with the width of the sidewall insulating film 315 (here, the widths of portions where the sidewall insulating films 315a and 315b are in contact with the oxide semiconductor film 340 in FIG. 6B). As the area of the low-concentration regions is increased, an electric field applied to the first region 305 functioning as a channel formation region can be further relieved. The width of the sidewall insulating film 315 depends on the thickness of the first electrode 313; therefore, the thickness of the first electrode 313 may be determined so that the pair of second regions 307a and 307b has a desired area.

Figure 7D:
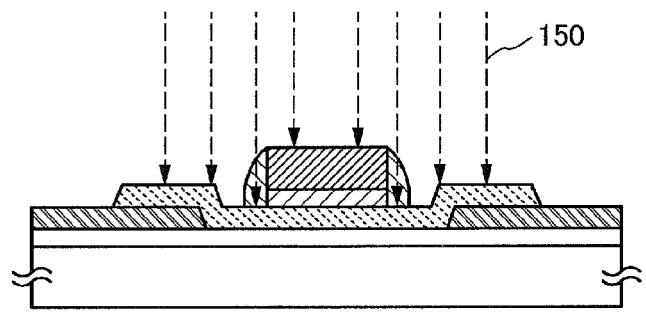
Figure 7E:
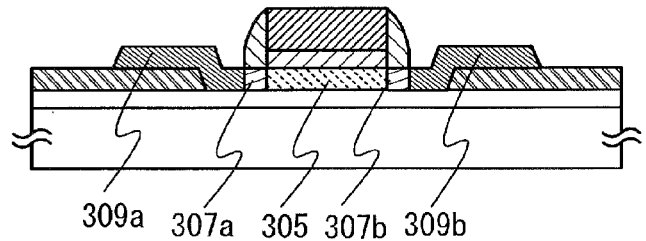

Next, treatment for adding the dopant 150 to the oxide semiconductor film 340 is performed (see FIG. 7D). The treatment for adding the dopant 150 to the oxide semiconductor film 340 may be performed as in Embodiment 1. By this treatment, the first region 305, the pair of second regions 307a and 307b, and the pair of third regions 309a and 309b are formed (see FIG. 7E). Note that the first region 305, the pair of second regions 307a and 307b, and the pair of third regions 309a and 309b which are formed by this treatment have structures similar to those of the first region 105, the pair of second regions 107a and 107b, and the pair of third regions 109a and 109b described in Embodiment 1.

Further, as in the case of the transistor 200, the transistor 300 has a structure in which the dopant 150 is added with part of the oxide semiconductor film 340 exposed. Therefore, as a method for adding the dopant 150, plasma treatment can be used as in Embodiment 2. Note that the plasma treatment is similar to the plasma treatment described in Embodiment 2.

In the case where portions of the oxide semiconductor film 340 to be the pair of third regions 309a and 309b are exposed as in the transistor 300, if a rare gas element is added as the dopant by plasma treatment, the portions to be the pair of third regions 309a and 309b might be etched and decreased in thickness as described in Embodiment 1. Therefore, in the case where the portions of the oxide semiconductor film 340 to be the pair of third regions 309a and 309b are exposed, hydrogen is preferably used as the dopant.

Even in the case where the gate insulating film 311 is also provided over the third regions 309a and 309b (and further over the second electrode 319a and the third electrode 319b) as in Embodiment 1, the treatment for adding the dopant 150 to the oxide semiconductor film 340 can be performed. In that case, the dopant 150 is added to the oxide semiconductor film 340 through the gate insulating film 311 and the sidewall insulating films 315a and 315b. In the case of such a structure, a rare gas element can be used as the dopant 150 without any problem.

Note that the treatment for adding the dopant 150 to the oxide semiconductor film 340 can be performed plural times as in Embodiment 1.

Further, heat treatment may be performed after the dopant 150 is added. The heat treatment may be performed in a manner similar to that of heat treatment performed in the formation of the oxide semiconductor film 340, and is preferably performed at a temperature at which the pair of second regions 307a and 307b and the pair of third regions 309a and 309b are not crystallized.

Next, the interlayer insulating film 317 is formed over the first electrode 313, the second electrode 319a, the third electrode 319b, and the sidewall insulating films 315a and 315b in a manner similar to that of the interlayer insulating film 117 described in Embodiment 1. Through the above steps, the transistor 300 can be manufactured (see FIG. 6B).

The transistor 300 described in this embodiment can achieve an effect similar to that in Embodiment 1. Note that this embodiment can be combined with any of the other embodiments as appropriate.

(Embodiment 4)

In this embodiment, as for the transistors described in Embodiments 1 to 3, influences of electric characteristics of the first region, the pair of second regions, and the pair of third regions which are included in the oxide semiconductor film on the transistor will be described using band diagrams. Note that the transistor 300 illustrated in FIGS. 6A and 6B will be used as an example.

FIGS. 8A and 8B are each an energy band diagram (a schematic diagram) of the transistor 300 (see FIG. 6B) in a cross section along G-H. Note that FIG. 8B shows the case where the potential of a source region is equal to that of a drain region (VD=0 V). The transistor 300 includes the oxide semiconductor film 303 including the first region 305 (denoted by OS1), the pair of second regions 307a and 307b (denoted by OS2), and the pair of third regions 309a and 309b (denoted by OS3); and the second and third electrodes 319a and 319b (denoted by metal).

The channel formation region of the transistor 300 is formed using OS1, and OS1 is formed using an intrinsic (i-type) oxide semiconductor or a substantially intrinsic oxide semiconductor which is obtained by removing or eliminating impurities such as moisture (including hydrogen) from the film as much as possible so that the purity is increased. Thus, the Fermi level (Ef) can be at the same level as the intrinsic Fermi level (Ei).

The low-concentration regions of the transistor 300 are formed using OS2, and the source region and the drain region are formed using OS3. As in the case of OS1, each of OS2 and OS3 is formed using an intrinsic (i-type) or substantially intrinsic oxide semiconductor which is obtained by removing or eliminating impurities such as moisture (including hydrogen) from the film as much as possible so that the purity is increased. Then, hydrogen or one or more elements selected from rare gas elements are added as a dopant to OS2 and OS3 so as to function as a donor or cause an oxygen vacancy. Accordingly, OS2 and OS3 each have high carrier density and a Fermi level close to the conduction band, as compared with OS1.

FIG. 8A shows the relation between the vacuum level (denoted by Evac) and band structures of the first region 305 (denoted by OS1), the pair of second regions 307a and 307b (denoted by OS2), the pair of third regions 309a and 309b (denoted by OS3), and the second and third electrodes 319a and 319b (denoted by metal). Here, IP represents the ionization potential; Ea, the electron affinity; Eg, the band gap; and Wf, the work function. In addition, Ec represents the conduction band minimum; Ev, the valence band maximum; and Ef, the Fermi level. As for a sign at the end of each symbol, 1 denotes OS1, 2 denotes OS2, 3 denotes OS3, and m denotes metal. Here, a metal having a work function of 4.1 eV (such as titanium) is assumed as metal.

OS1 is a highly purified oxide semiconductor and thus has extremely low carrier density; therefore, Ef_1 is around the middle point between Ec and Ev. Further, OS2 and OS3 are each an oxide semiconductor having high carrier density, to which a dopant is added, and Ec_2 and Ec_3 generally correspond to Ef_2 and Ef_3, respectively. Each of the oxide semiconductors denoted by OS1, OS2, and OS3 is said to have a band gap (Eg) of 3.15 eV and an electron affinity (Ea) of 4.3 eV.

As illustrated in FIG. 8B, when OS1 serving as the channel formation region is in contact with OS2 serving as the low-concentration regions, carriers transfer so that the Fermi levels of OS1 and OS2 become equal and band edges of OS1 and OS2 are curved. Similarly, when OS2 serving as the low-concentration regions is in contact with OS3 serving as the source region and the drain region, carriers transfer so that the Fermi levels of OS2 and OS3 become equal and band edges of OS2 and OS3 are curved. Further, similarly, when OS3 serving as the source region and the drain region is in contact with metal, carriers transfer so that the Fermi levels of OS3 and metal become equal and band edges of OS3 are curved.

As described above, OS2 and OS3 which are oxide semiconductors having different high carrier densities are formed between OS1 serving as the channel and metal serving as the second electrode 319a and the third electrode 319b, whereby an ohmic contact can be formed between the oxide semiconductor film 303 and metal, and the contact resistance can be reduced. As a result, the on-state current of the transistor 300 can be increased. Moreover, the curve at the band edges of OS1 can be suppressed, and thus a short-channel effect in the transistor 300 can be reduced.

(Embodiment 5)

In this embodiment, examples of transistors which are different from the transistors described in the above embodiments will be described with reference to FIGS. 9A to 9D.

Figure 9A:
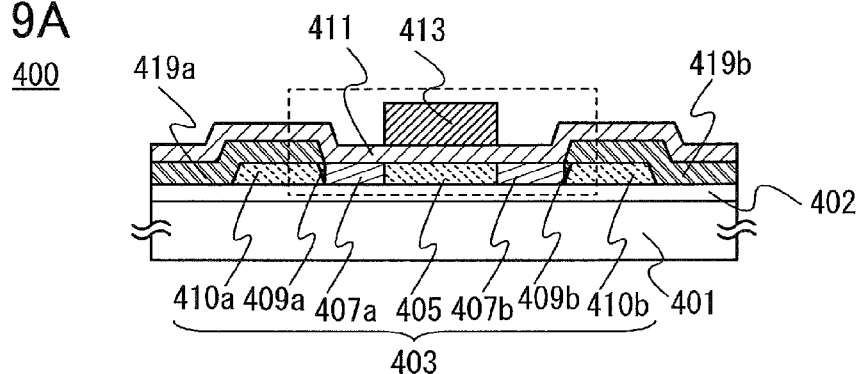
FIGS. 9A to 9D are cross-sectional views illustrating examples of a semiconductor device which is one embodiment of the present invention.
Figure 9B:
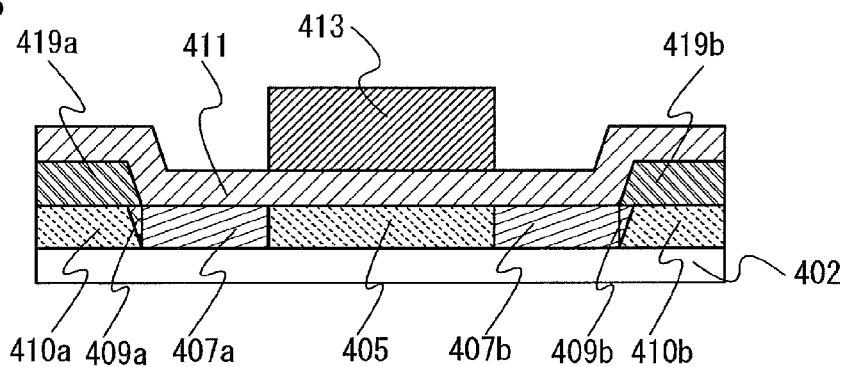

FIG. 9A is a cross-sectional view of a transistor 400, and FIG. 9B is an enlarged view of a portion surrounded by a dotted line in FIG. 9A.

The transistor 400 has the following structure. A base insulating film 402 is provided over a substrate 401. An oxide semiconductor film 403 including a first region 405, a pair of second regions 407a and 407b, a pair of third regions 409a and 409b, and a pair of fourth regions 410a and 410b is provided over the base insulating film 402. A second electrode 419a and a third electrode 419b are provided over the pair of fourth regions 410a and 410b. A gate insulating film 411 is provided over the first region 405, the pair of second regions 407a and 407b, the pair of third regions 409a and 409b, the pair of fourth regions 410a and 410b, the second electrode 419a, and the third electrode 419b. A first electrode 413 is provided over the gate insulating film 411 to overlap with the first region 405.

The transistor 400 is a top-gate top-contact transistor and is different from the transistor 100, the transistor 200, and the transistor 300 in that the pair of fourth regions 410a and 410b is provided.

The substrate 401, the base insulating film 402, the first region 405, the gate insulating film 411, the first electrode 413, the second electrode 419a, and the third electrode 419b can be formed in manners similar to those of the substrate 101, the base insulating film 102, the first region 105, the gate insulating film 111, the first electrode 113, the second electrode 119a, and the third electrode 119b described in Embodiment 1.

The first region 405 serving as a channel formation region is the CAAC oxide semiconductor region described in Embodiment 1, and the pair of fourth regions 410a and 410b also is the CAAC oxide semiconductor region described in Embodiment 1. The pair of second regions 407a and 407b and the pair of third regions 409a and 409b are each an amorphous region containing a dopant, and the dopant is similar to that described in Embodiment 1. Further, the dopant concentration of the pair of second regions 407a and 407b is different from the dopant concentration of the pair of third regions 409a and 409b. The dopant concentrations of the pair of second regions 407a and 407b and the pair of third regions 409a and 409b are within the respective ranges of dopant concentrations described in Embodiment 1.

In the transistor 400, after formation of the oxide semiconductor film 140 described in Embodiment 1, regions having different dopant concentrations (the first region 405, the pair of second regions 407a and 407b, the pair of third regions 409a and 409b, and the pair of fourth regions 410a and 410b) can be formed by utilizing the first electrode 413, the second electrode 419a, and the third electrode 419b.

The pair of third regions 409a and 409b is formed owing to tapered shapes of the second electrode 419a and the third electrode 419b. In addition, by reducing the thicknesses of the second electrode 419a and the third electrode 419b, the area of the pair of third regions 409a and 409b can be increased.

Note that each of the transistor 100, the transistor 200, and the transistor 300 is a transistor in which the regions having different dopant concentrations (the first region, the pair of second regions, and the pair of third regions) are formed by utilizing the first electrode and the sidewall insulating film.

As described above, in the transistor 400, the pair of second regions 407a and 407b and the pair of third regions 409a and 409b, which have different dopant concentrations, are provided with the first region 405 serving as the channel formation region positioned in the middle; therefore, an electric field applied to the first region 405 serving as the channel formation region can be relieved and thus a short-channel effect can be suppressed.

Besides the transistor 400, a transistor 500 will be described as an example of a transistor which is different from the transistors described in the above embodiments.

Figure 9C:
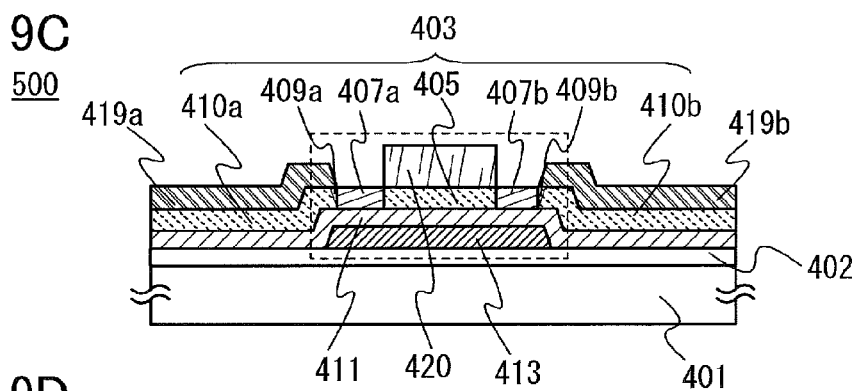
Figure 9D:
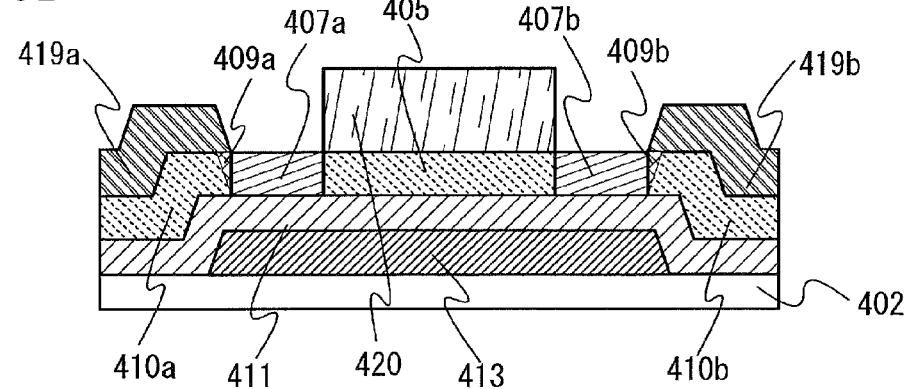

FIG. 9C is a cross-sectional view of the transistor 500, and FIG. 9D is an enlarged view of a portion surrounded by a dotted line in FIG. 9C.

The transistor 500 has the following structure. The base insulating film 402 is provided over the substrate 401. The first electrode 413 and the gate insulating film 411 which covers the first electrode 413 are provided over the base insulating film 402. The oxide semiconductor film 403 including the first region 405, the pair of second regions 407a and 407b, the pair of third regions 409a and 409b, and the pair of fourth regions 410a and 410b is provided over the gate insulating film 411. The second electrode 419a and the third electrode 419b are provided over the pair of fourth regions 410a and 410b. An insulating film 420 is provided over the first region 405.

The transistor 500 is a bottom-gate top-contact transistor and is different from the transistor 100, the transistor 200, and the transistor 300 in that the pair of fourth regions 410a and 410b is provided.

The substrate 401, the base insulating film 402, the first region 405, the gate insulating film 411, the first electrode 413, the second electrode 419a, and the third electrode 419b can be formed in manners similar to those of the substrate 101, the base insulating film 102, the first region 105, the gate insulating film 111, the first electrode 113, the second electrode 119a, and the third electrode 119b described in Embodiment 1. Since the transistor 500 has a bottom-gate structure, the first electrode 413 preferably has a tapered shape as in the case of the second electrode 419a and the third electrode 419b. The first electrode 413 is formed to have a tapered shape, whereby the coverage with the gate insulating film 411 can be improved.

The first region 405 serving as a channel formation region is the CAAC oxide semiconductor region described in Embodiment 1, and the pair of fourth regions 410a and 410b also is the CAAC oxide semiconductor region described in Embodiment 1. The pair of second regions 407a and 407b and the pair of third regions 409a and 409b are each an amorphous region containing a dopant, and the dopant is similar to that described in Embodiment 1. Further, the dopant concentration of the pair of second regions 407a and 407b is different from the dopant concentration of the pair of third regions 409a and 409b. The dopant concentrations of the pair of second regions 407a and 407b and the pair of third regions 409a and 409b are within the respective ranges of dopant concentrations described in Embodiment 1.

In the transistor 500, after the oxide semiconductor film 140 described in Embodiment 1 is formed over the gate insulating film 411, regions having different dopant concentrations (the first region 405, the pair of second regions 407a and 407b, the pair of third regions 409a and 409b, and the pair of fourth regions 410a and 410b) can be formed by utilizing the second electrode 419a, the third electrode 419b, and the insulating film 420. It is necessary that the insulating film 420 be formed to have a thickness large enough to prevent the dopant from being added to the first region 405.

Further, the pair of third regions 409a and 409b is formed owing to tapered shapes of the second electrode 419a and the third electrode 419b. In addition, by reducing the thicknesses of the second electrode 419a and the third electrode 419b, the area of the pair of third regions 409a and 409b can be increased.

Note that each of the transistor 100, the transistor 200, and the transistor 300 is a transistor in which the regions having different dopant concentrations (the first region, the pair of second regions, and the pair of third regions) are formed by utilizing the first electrode and the sidewall insulating film.

As described above, in the transistor 500, the pair of second regions 407a and 407b and the pair of third regions 409a and 409b, which have different dopant concentrations, are provided with the first region 405 serving as the channel formation region positioned in the middle; therefore, an electric field applied to the first region 405 serving as the channel formation region can be relieved and thus a short-channel effect can be suppressed.

(Embodiment 6)

In this embodiment, resistor elements each including an oxide semiconductor to which a dopant is added will be described with reference to FIGS. 10A and 10B.

Figure 10A:
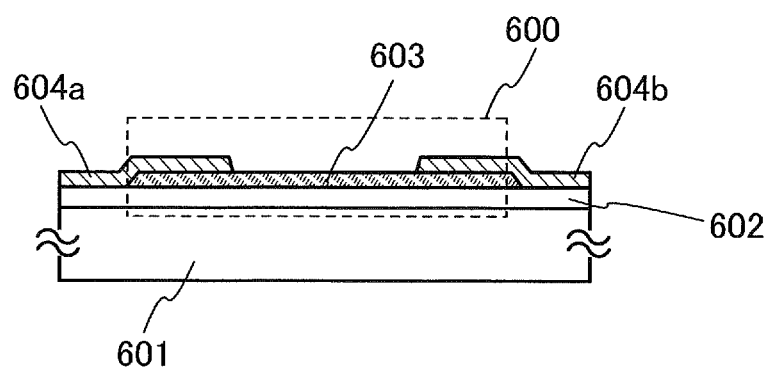
FIGS. 10A and 10B are cross-sectional views illustrating examples of a resistor element which is one embodiment of the present invention.

FIG. 10A illustrates a resistor element 600. The structure of the resistor element 600 will be described below. A base insulating film 602 is provided over a substrate 601. An oxide semiconductor film 603 to which a dopant is added is provided over the base insulating film 602. Conductive films 604a and 604b are provided over the oxide semiconductor film 603. That is, the oxide semiconductor film 603 serves as a resistor in the resistor element 600. The oxide semiconductor film 603 to which the dopant is added can be formed, for example, in such a manner that a portion where the gate insulating film 211 and the first electrode 213 are not formed over the oxide semiconductor film 140 described in Embodiment 2 (see FIGS. 5A and 5B) is prepared and then the dopant is added to the portion. The conductive films 604a and 604b can be formed using a conductive material which can be used for the first electrodes described in the above embodiments.

Figure 10B:
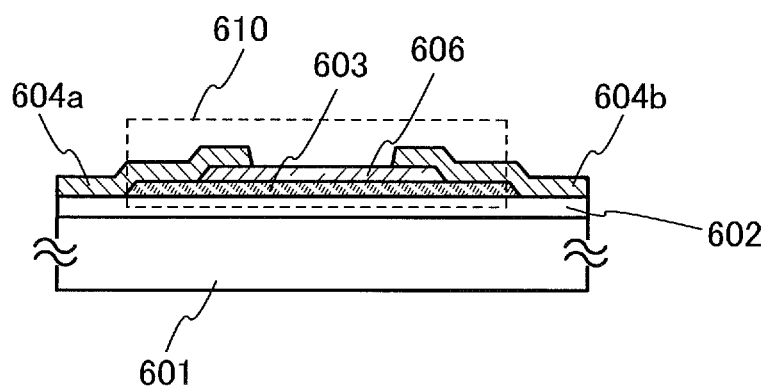

FIG. 10B illustrates a resistor element 610. The structure of the resistor element 610 will be described below. The base insulating film 602 is provided over the substrate 601. The oxide semiconductor film 603 to which a dopant is added is provided over the base insulating film 602. An insulating film 606 is provided over the oxide semiconductor film 603. The conductive films 604a and 604b are provided in contact with the insulating film 606 and part of the oxide semiconductor film 603. The oxide semiconductor film 603 serves as a resistor also in the resistor element 610. The oxide semiconductor film 603 to which the dopant is added can be formed, for example, in such a manner that a portion where the gate insulating film 211 and the first electrode 213 are not formed over the oxide semiconductor film 140 described in Embodiment 2 (see FIGS. 5A and 5B) is prepared and then the dopant is added to the portion. As the insulating film 606, any of the base insulating films, the gate insulating films, and the interlayer insulating films described in the above embodiments may be used as appropriate. The conductive films 604a and 604b can be formed using a conductive material which can be used for the first electrodes described in the above embodiments. In this manner, in the resistor element 610, a current path in the oxide semiconductor film 603 which serves as a resistor and is in contact with the conductive films 604a and 604b can be uniform and more accurate resistance can be obtained.

(Embodiment 7)

Figure 11A:
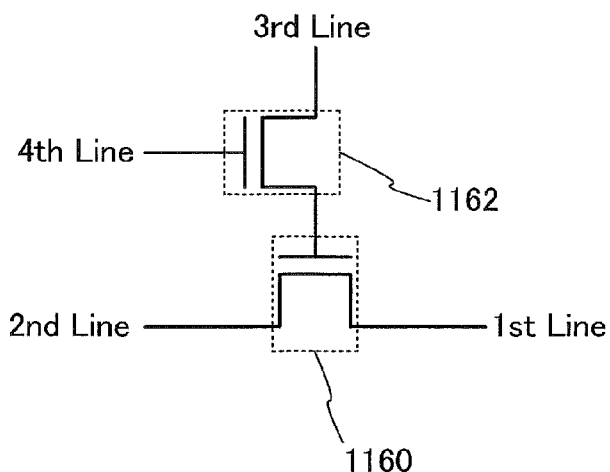
FIGS. 11A and 11B are examples of circuit diagrams each illustrating one embodiment of the present invention.

An example of a circuit diagram of a memory element (hereinafter also referred to as a memory cell) included in a semiconductor device is illustrated in FIG. 11A. The memory cell includes a transistor 1160 in which a channel formation region is formed using a material other than an oxide semiconductor and a transistor 1162 in which a channel formation region is formed using an oxide semiconductor.

The transistor 1162 in which the channel formation region is formed using an oxide semiconductor can be manufactured in accordance with any of the above embodiments.

As illustrated in FIG. 11A, a gate electrode of the transistor 1160 is electrically connected to one of a source electrode and a drain electrode of the transistor 1162. A first wiring (a 1st Line, also referred to as a source line) is electrically connected to a source electrode of the transistor 1160. A second wiring (a 2nd Line, also referred to as a bit line) is electrically connected to a drain electrode of the transistor 1160. A third wiring (a 3rd Line, also referred to as a first signal line) is electrically connected to the other of the source electrode and the drain electrode of the transistor 1162. A fourth wiring (a 4th Line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its off-state current which is smaller than the off-state current of the transistor 1160. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data will be described. First, a potential of the fourth wiring is set to a potential at which the transistor 1162 is turned on, so that the transistor 1162 is turned on. Thus, a potential of the third wiring is supplied to the gate electrode of the transistor 1160 (writing). After that, the potential of the fourth wiring is set to a potential at which the transistor 1162 is turned off, so that the transistor 1162 is turned off, and thus, the potential of the gate electrode of the transistor 1160 is held (holding).

Since the off-state current of the transistor 1162 is smaller than the off-state current of the transistor 1160, the potential of the gate electrode of the transistor 1160 is held for a long time. For example, when the potential of the gate electrode of the transistor 1160 is a potential at which the transistor 1160 is in an on state, the on state of the transistor 1160 is held for a long time. In addition, when the potential of the gate electrode of the transistor 1160 is a potential at which the transistor 1160 is an off state, the off state of the transistor 1160 is held for a long time.

Then, reading of data will be described. When a predetermined potential (a low potential) is supplied to the first wiring in a state where the on state or the off state of the transistor 1160 is held as described above, a potential of the second wiring varies depending on the on state or the off state of the transistor 1160. For example, when the transistor 1160 is in the on state, the potential of the second wiring becomes lower than the potential of the first wiring. On the other hand, when the transistor 1160 is in the off state, the potential of the second wiring is not changed.

In such a manner, the potential of the second wiring and the predetermined potential are compared with each other in a state where data is held, whereby the data can be read out.

Then, rewriting of data will be described. Rewriting of data is performed in a manner similar to that of the writing and holding of data. That is, a potential of the fourth wiring is set to a potential at which the transistor 1162 is turned on, so that the transistor 1162 is turned on. Thus, a potential of the third wiring (a potential for new data) is supplied to the gate electrode of the transistor 1160. After that, the potential of the fourth wiring is set to a potential at which the transistor 1162 is turned off, so that the transistor 1162 is turned off, and thus, the new data is held.

In the memory cell according to the disclosed invention, data can be directly rewritten by another writing of data as described above. For that reason, erasing operation which is necessary for a flash memory or the like is not needed, so that decrease in operation speed because of erasing operation can be suppressed. In other words, high-speed operation of the semiconductor device including the memory cell can be realized.

Figure 11B:
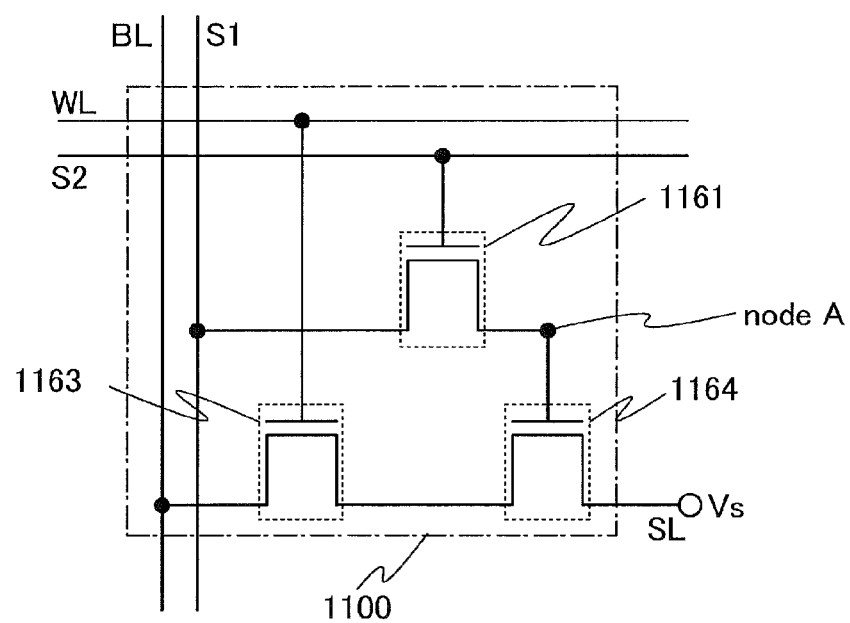

FIG. 11B is a circuit diagram illustrating an application example of the memory cell illustrated in FIG. 11A.

A memory cell 1100 illustrated in FIG. 11B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, operation of the circuit will be specifically described.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that, to finish writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of data "1" and set to approximately 0 V after the writing of data "0". Electric charge corresponding to a potential of the third wiring S1 is accumulated at the node A; since the off-state current of the transistor 1161 is smaller than that of a transistor in which a channel formation region is formed using single crystal silicon, the potential of the gate electrode of the transistor 1164 is held for a long time.

When data is read from the memory cell, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1163 is in an on state and the transistor 1161 is in an off state.

The transistor 1164 is in an off state when data "0" has been written, that is, the node A is set to approximately 0 V, so that the resistance between the second wiring BL and the first wiring SL is high. On the other hand, the transistor 1164 is in an on state when data "1" has been written, that is, the node A is set to approximately 2 V, so that the resistance between the second wiring BL and the first wiring SL is low. The reading circuit can read data "0" or data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

In this embodiment, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 11A or 11B and can be changed as appropriate.

Figure 12:
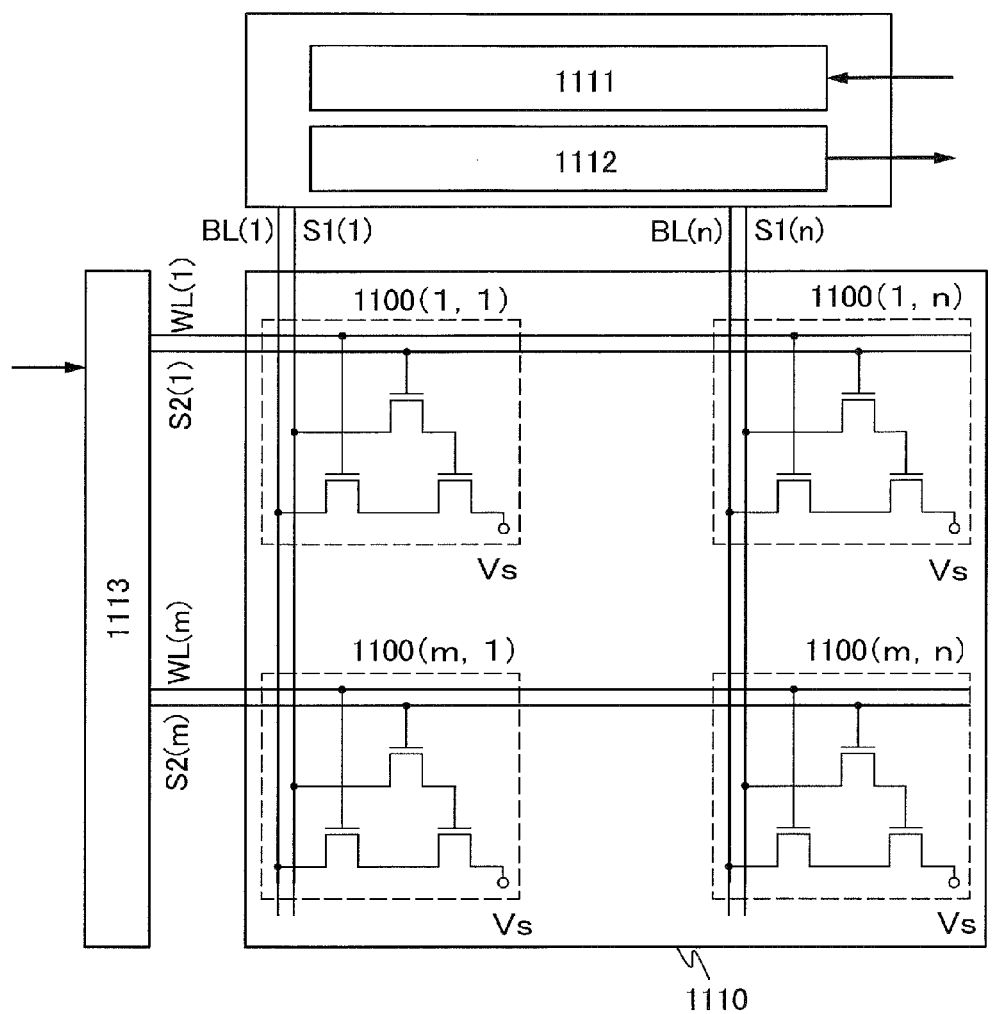
FIG. 12 is an example of a circuit diagram illustrating one embodiment of the present invention.

FIG. 12 is a block circuit diagram of a semiconductor device according to one embodiment of the present invention. The semiconductor device has m×n bits of memory capacity.

The semiconductor device illustrated in FIG. 12 includes m fourth wirings S2(1) to S2(m), m fifth wirings WL(1) to WL(m), n second wirings BL(1) to BL(n), n third wirings S1(1) to S1(n), a memory cell array 1110 in which a plurality of memory cells 1100(1,1) to 1100($m,n$) is arranged in a matrix of m rows by n columns (m and n are each a natural number), and peripheral circuits such as a driver circuit 1111 for the second wirings and the third wirings, a driver circuit 1113 for the fourth wirings and the fifth wirings, and a reading circuit 1112. A refresh circuit or the like may be provided as another peripheral circuit.

A memory cell 1100(i,j) is considered as a typical example of the memory cell. Here, the memory cell 1100(i,j) (i is an integer greater than or equal to 1 and less than or equal to m and j is an integer greater than or equal to 1 and less than or equal to n) is connected to a second wiring BL(j), a third wiring S1(j), a fourth wiring S2(i), a fifth wiring WL(i), and a first wiring. A first wiring potential Vs is supplied to the first wiring. The second wirings BL(1) to BL(n) and the third wirings S1(1) to S1(n) are connected to the driver circuit 1111 for the second wirings and the third wirings and the reading circuit 1112. The fifth wirings WL(1) to WL(m) and the fourth wirings S2(1) to S2(m) are connected to the driver circuit 1113 for the fourth wirings and the fifth wirings.

The operation of the semiconductor device illustrated in FIG. 12 will be described. In this structure, data is written and read per row.

When data is written into memory cells 1100(1,1) to 1100(i,n) of an i-th row, the first wiring potential Vs is set to 0 V, the fifth wiring WL(i) is set to 0 V, the second wirings BL(1) to BL(n) are set to 0 V, and the fourth wiring S2(1) is set to 2 V. At this time, the transistors 1161 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2(1) is set to 0 V before the potentials of the third wirings S1(1) to S1(n) are changed, so that the transistors 1161 are turned off. Moreover, a non-selected fifth wiring WL and a non-selected fourth wiring S2 are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V (see FIG. 11B and FIG. 12). The potential of the node A of the non-selected memory cell is not changed.

When data is read from the memory cells 1100(1,1) to 1100(i,n) of the i-th row, the first wiring potential Vs is set to 0 V, the fifth wiring WL(i) is set to 2 V, the fourth wiring S2(1) is set to 0 V, the third wirings S1(1) to S1(n) are set to 0 V, and the reading circuit connected to the second wirings BL(1) to BL(n) is set in an operation state. The reading circuit can read data "0" or data "1" in accordance with the difference in resistance state of the memory cell, for example. Note that the non-selected fifth wiring WL and the non-selected fourth wiring S2 are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

(Embodiment 8)

Figure 13A:
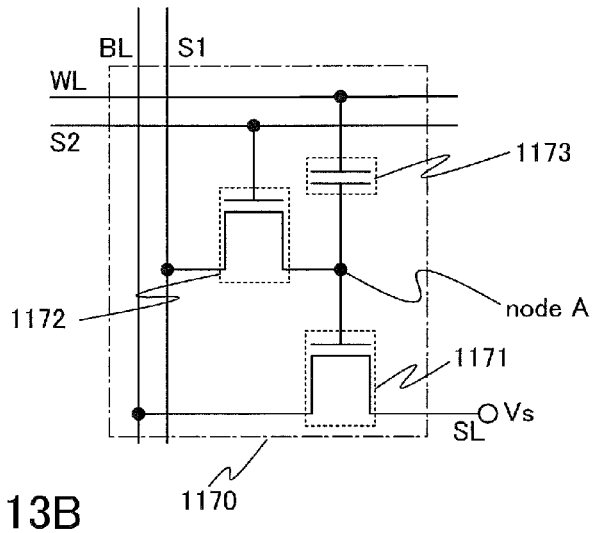
FIGS. 13A and 13B are examples of circuit diagrams each illustrating one embodiment of the present invention.

In this embodiment, an example of a circuit diagram of a memory cell including a capacitor will be shown. A memory cell 1170 illustrated in FIG. 13A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

Here, a gate electrode of the transistor 1171, one of a source electrode and a drain electrode of the transistor 1172, and one electrode of the capacitor 1173 are electrically connected to each other. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is set to 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1172 is turned off.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of the reading is set to 0 V; however, it may be in a floating state or may be charged to have a potential higher than 0 V. Data "1" and data "0" are defined for convenience and can be reversed.

The potential of the third wiring S1 at the time of writing may be selected from the potentials of data "0" and data "1" so that the transistor 1172 is turned off after the writing and the transistor 1171 is in an off state in the case where the potential of the fifth wiring WL is set to 0 V. The potential of the fifth wiring WL at the time of reading is set so that the transistor 1171 is turned off in the case of data "0" and turned on in the case of data "1". Furthermore, the threshold voltage of the transistor 1171 is an example. The transistor 1171 can have any threshold voltage so that the transistor 1171 can operate in the above-described manner.

An example of a NOR-type semiconductor memory device in which a memory cell including a capacitor and a selection transistor having a first gate electrode and a second gate electrode is used will be described with reference to FIG. 13B.

Figure 13B:
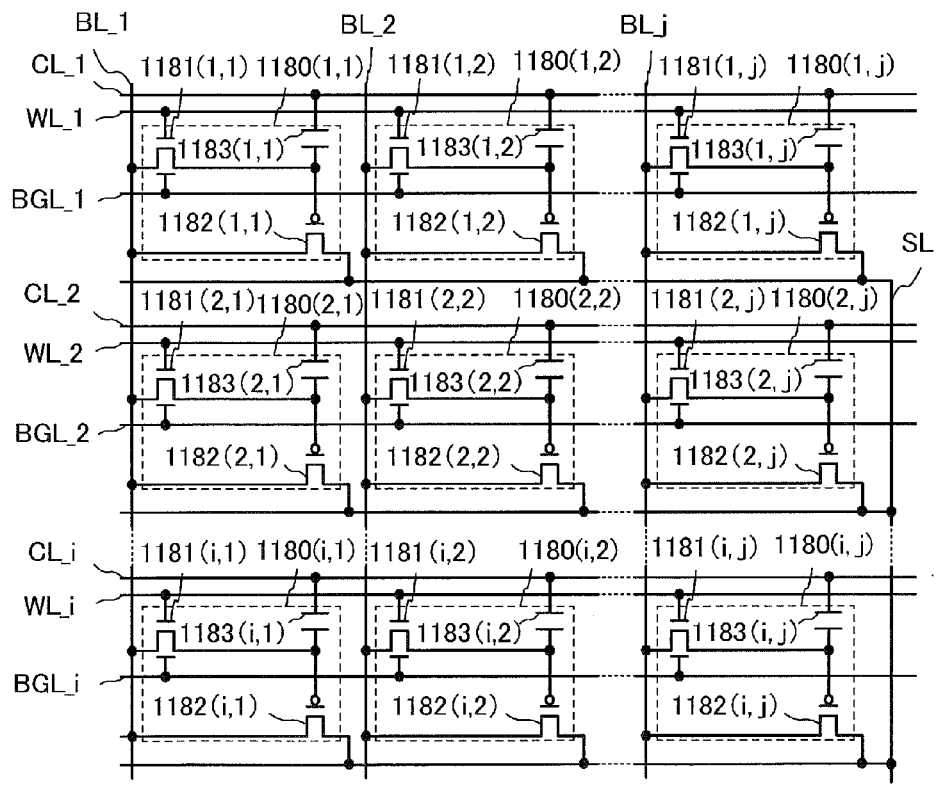

A semiconductor device illustrated in FIG. 13B according to one embodiment of the present invention includes a memory cell array including a plurality of memory cells arranged in a matrix of I rows (I is a natural number of 2 or more) by J columns (J is a natural number).

The memory cell array illustrated in FIG. 13B includes a plurality of memory cells 1180 arranged in a matrix of i rows (i is a natural number of 3 or more) by j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

Further, each of the plurality of memory cells 1180 (also referred to as a memory cell 1180(M,N) (note that N is a natural number greater than or equal to 1 and less than or equal to j and that M is a natural number greater than or equal to 1 and less than or equal to i)) includes a transistor 1181(M,N), a capacitor 1183(M,N), and a transistor 1182 (M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with voltage applied between the first capacitor electrode and the second capacitor electrode.

The transistor 1181(M,N) is an n-channel transistor, which has a source electrode, a drain electrode, a first gate electrode, and a second gate electrode. Note that in the semiconductor memory device in this embodiment, the transistor 1181 does not necessarily need to be an n-channel transistor.

One of the source electrode and the drain electrode of the transistor 1181(M,N) is connected to a bit line BL_N. The first gate electrode of the transistor 1181(M,N) is connected to a word line WL_M The second gate electrode of the transistor 1181(M,N) is connected to a gate line BGL_M.

With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 does not necessarily need to be a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to a capacitor line CL M. A second capacitor electrode of the capacitor 1183(M,N) is connected to the other of the source electrode and the drain electrode of the transistor 1181(M,N). Note that the capacitor 1183(M,N) serves as a storage capacitor.

The voltages of the word lines WL_1 to WL_i are controlled by, for example, a driver circuit including a decoder.

The voltages of the bit lines BL_1 to BL_j are controlled by, for example, a driver circuit including a decoder.

The voltages of the capacitor lines CL_1 to CL_i are controlled by, for example, a driver circuit including a decoder.

The voltages of the gate lines BGL_1 to BGL_i are controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be made extremely small. Thus, a data retention period in the memory circuit can be made longer. In addition, voltage necessary for writing and reading data can be made lower than that of a conventional semiconductor device; thus, power consumption can be reduced.

(Embodiment 9)

In this embodiment, examples of a semiconductor device using the transistor described in any of the above embodiments will be described with reference to FIGS. 14A and 14B.

Figure 14A:
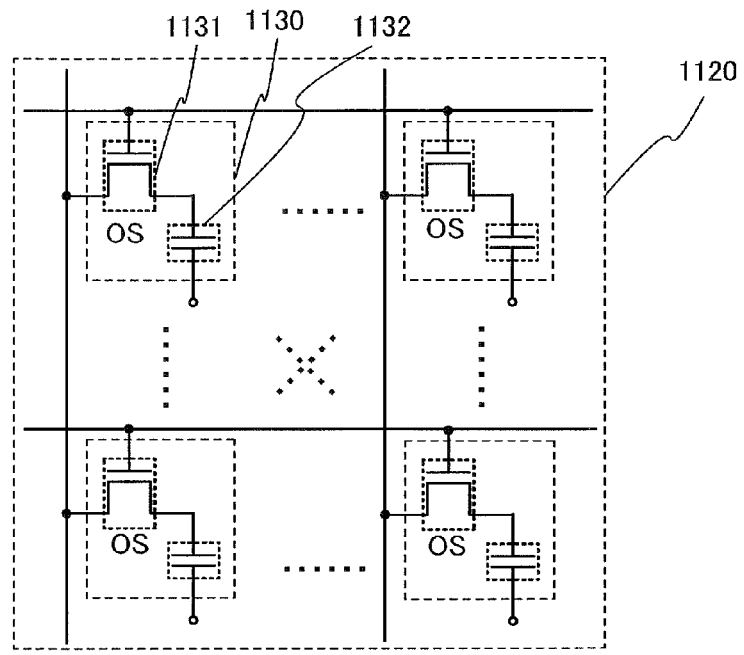
FIGS. 14A and 14B are examples of circuit diagrams each illustrating one embodiment of the present invention.

FIG. 14A illustrates an example of a semiconductor device whose structure corresponds to that of a so-called dynamic random access memory (DRAM). A memory cell array 1120 illustrated in FIG. 14A has a structure in which a plurality of memory cells 1130 is arranged in a matrix. Further, the memory cell array 1120 includes m first wirings and n second wirings. Note that in this embodiment, the first wiring and the second wiring are referred to as a bit line BL and a word line WL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131.

The transistor in which a channel formation region is formed using an oxide semiconductor, which is described in any of the above embodiments, is characterized by having smaller off-state current than a transistor in which a channel formation region is formed using single crystal silicon. Accordingly, when the transistor is applied to the semiconductor device illustrated in FIG. 14A, which is regarded as a so-called DRAM, a substantially nonvolatile memory can be obtained.

Figure 14B:
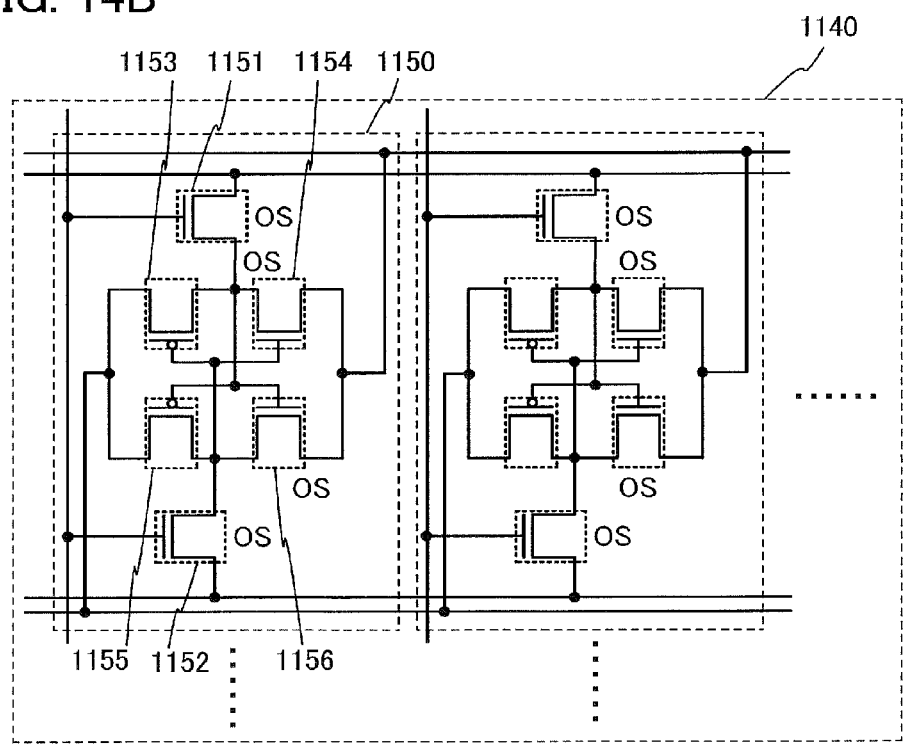

FIG. 14B illustrates an example of a semiconductor device whose structure corresponds to that of a so-called static random access memory (SRAM). A memory cell array 1140 illustrated in FIG. 14B can have a structure in which a plurality of memory cells 1150 is arranged in a matrix. Further, the memory cell array 1140 includes a plurality of first wirings (word lines WL), a plurality of second wirings (bit lines BL), and a plurality of third wirings (inverted bit lines /BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

The methods, structures, and the like described in this embodiment can be combined with any of the methods, structures, and the like described in the other embodiments, as appropriate.

(Embodiment 10)

A central processing unit (CPU) can be formed using a transistor in which a channel formation region is formed using an oxide semiconductor for at least part of the CPU.

Figure 15A:
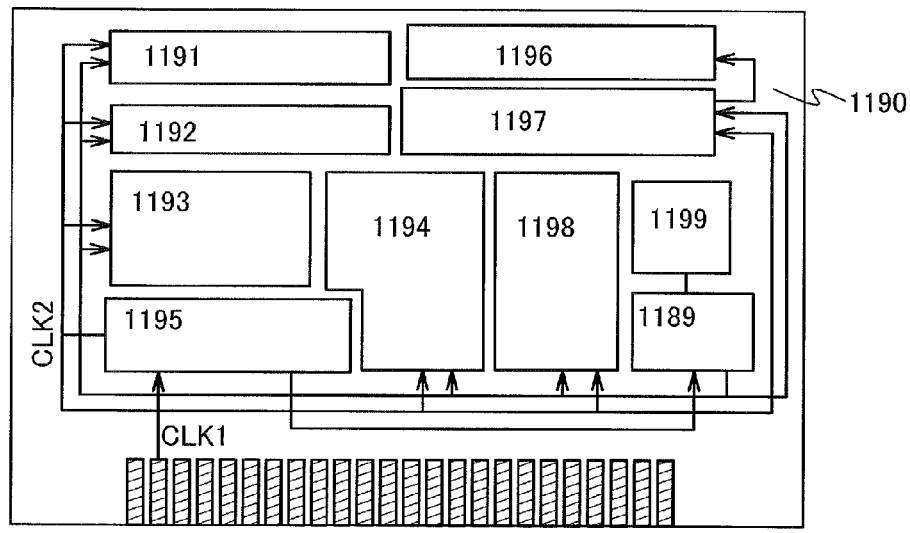
FIG. 15A is a block diagram illustrating a specific example of a CPU.

FIG. 15A is a block diagram illustrating a specific structure of a CPU. The CPU illustrated in FIG. 15A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 15A is only an example in which the structure is simplified, and an actual CPU may have various structures depending on the application.

An instruction that is input to the CPU through the Bus I/F 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 15A, a memory element is provided in the register 1196. The memory element described in Embodiment 8 can be used as the memory element provided in the register 1196.

In the CPU illustrated in FIG. 15A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 15B:
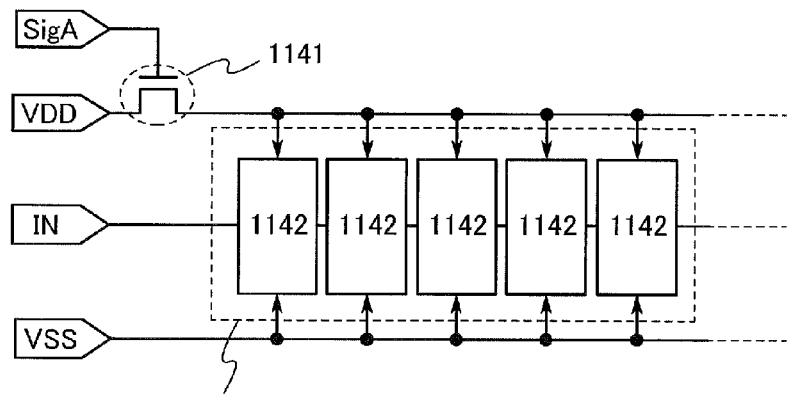
FIGS. 15B and 15C are circuit diagrams of part thereof.
Figure 15C:
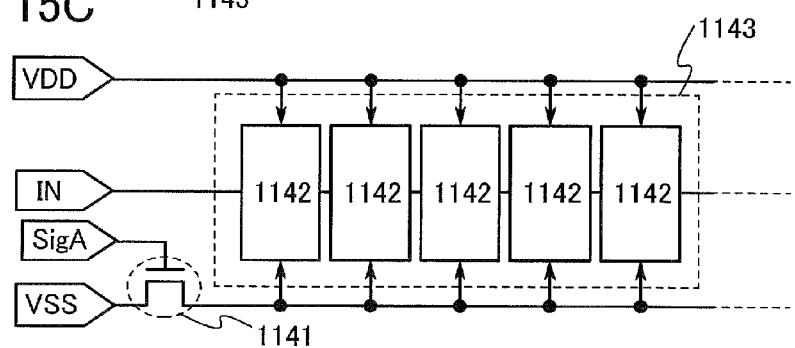

The power supply can be stopped by providing a switching element between a memory element group and a node to which a power supply potential VDD or a power supply potential VSS is supplied, as illustrated in FIG. 15B or FIG. 15C. Circuits illustrated in FIGS. 15B and 15C will be described below.

FIGS. 15B and 15C each illustrate an example of a structure of a memory circuit including a transistor in which a channel formation region is formed using an oxide semiconductor as a switching element for controlling supply of a power supply potential to a memory element.

The memory device illustrated in FIG. 15B includes a switching element 1141 and a memory element group 1143 including a plurality of memory elements 1142. Specifically, as each of the memory elements 1142, the memory element described in Embodiment 8 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 15B, a transistor in which a channel formation region is formed using an oxide semiconductor is used as the switching element 1141, and the switching of the transistor is controlled by a signal Sig A supplied to a gate electrode thereof.

Note that FIG. 15B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 15B, the switching element 1141 may control the supply of the low-level power supply potential VSS.

In FIG. 15C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be combined with any of the above embodiments as appropriate.

This application is based on Japanese Patent Application serial no. 2010-292895 filed with the Japan Patent Office on Dec. 28, 2010, the entire contents of which are hereby incorporated by reference.

What is claimed is:

1. A semiconductor device comprising:
   a transistor comprising:
      an oxide semiconductor film comprising:
         a first region;
         a pair of second regions, the first region located between the pair of second regions; and
         a pair of third regions, the first region and the pair of second regions located between the pair of third regions;
      a gate insulating film over the oxide semiconductor film;
      a gate electrode over the gate insulating film and overlapping with the first region;
      a first electrode electrically connected to the oxide semiconductor film; and
      a second electrode electrically connected to the oxide semiconductor film, wherein the oxide semiconductor film comprises indium, gallium and zinc, wherein the gate electrode, the first electrode, and the second electrode comprise copper, wherein the gate insulating film comprises a fourth region overlapping with the first region and comprises a pair of fifth regions overlapping with at least a part of the pair of second regions, wherein the gate insulating film comprising the fourth region and the pair of fifth regions is one insulating film, wherein the gate insulating film is not in contact with a side surface of the gate electrode, and wherein a conductivity of the pair of third regions is higher than a conductivity of the pair of second regions.

2. The semiconductor device according to claim 1, wherein the first electrode is in contact with a top surface of the one of the pair of third regions, and wherein the second electrode is in contact with a top surface of the other of the pair of third regions.

3. The semiconductor device according to claim 1, wherein the gate insulating film is an oxide insulating film.

4. The semiconductor device according to claim 1, wherein the transistor is n-channel transistor.

5. A semiconductor device comprising:
a transistor comprising:
  an oxide semiconductor film comprising:
    a first region;
    a pair of second regions, the first region located between the pair of second regions; and
    a pair of third regions, the first region and the pair of second regions located between the pair of third regions;
  a gate insulating film over the oxide semiconductor film;
  a gate electrode over the gate insulating film and overlapping with the first region;
  a first electrode electrically connected to the oxide semiconductor film; and
  a second electrode electrically connected to the oxide semiconductor film, wherein the oxide semiconductor film comprises indium, gallium and zinc, wherein the gate electrode, the first electrode, and the second electrode comprise copper, wherein the gate insulating film comprises a fourth region overlapping with the first region and comprises a pair of fifth regions overlapping with at least a part of the pair of second regions, wherein the gate insulating film comprising the fourth region and the pair of fifth regions is one insulating film, wherein the gate insulating film is not in contact with a side surface of the gate electrode, and wherein a carrier density of the pair of third regions is higher than a carrier density of the pair of second regions.

6. The semiconductor device according to claim 5, wherein the first electrode is in contact with a top surface of the one of the pair of third regions, and wherein the second electrode is in contact with a top surface of the other of the pair of third regions.

7. The semiconductor device according to claim 5, wherein the gate insulating film is an oxide insulating film.

8. The semiconductor device according to claim 5, wherein the transistor is n-channel transistor.

* * * * *